United States Patent
Horie et al.

(10) Patent No.: US 7,811,972 B2
(45) Date of Patent: *Oct. 12, 2010

(54) METHOD OF POLISHING TAPE-SHAPED SUBSTRATE AND SUBSTRATE FOR OXIDE SUPERCONDUCTOR

(75) Inventors: Yuji Horie, Akishima (JP); Noriyuki Kumasaka, Akishima (JP); Sanaki Horimoto, Akishima (JP)

(73) Assignee: NIHON Micro Coating Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,346

(22) Filed: Aug. 19, 2008

(65) Prior Publication Data

US 2009/0054243 A1 Feb. 26, 2009

(30) Foreign Application Priority Data

Aug. 24, 2007 (JP) .............................. 2007-219072

(51) Int. Cl.
*H01L 39/24* (2006.01)
*H01L 39/12* (2006.01)

(52) U.S. Cl. ...................... 505/430; 505/433; 505/434; 505/813; 505/230; 505/232; 505/236; 505/239

(58) Field of Classification Search ................. 505/430, 505/433, 434, 813, 230, 232, 236, 239
See application file for complete search history.

(56) References Cited

U.S. PATENT DOCUMENTS

| 6,114,287 | A | * | 9/2000 | Lee et al. ..................... 505/473 |
| 2005/0016867 | A1 | * | 1/2005 | Kreiskott et al. ............ 205/640 |
| 2009/0054243 | A1 | * | 2/2009 | Horie et al. .................. 505/701 |
| 2009/0163122 | A1 | * | 6/2009 | Watanabe et al. ............. 451/57 |

FOREIGN PATENT DOCUMENTS

| JP | 2008016073 A | * | 1/2008 |
| JP | 2008036724 A | * | 2/2008 |
| JP | 2008049451 A | * | 3/2008 |
| WO | WO 2008004601 A1 | * | 1/2008 |
| WO | WO 2008023782 A1 | * | 2/2008 |

* cited by examiner

*Primary Examiner*—Douglas McGinty
(74) *Attorney, Agent, or Firm*—Weaver Austin Villeneuve & Sampson LLP

(57) ABSTRACT

A target surface of a tape-shaped substrate of an oxide superconductor with an intermediate layer formed on this target surface and an oxide superconductor thin film is polished by causing the tape-shaped substrate to continuously run. The polishing step includes an initial polishing process for carrying out random polishing of the target surface and a finishing process that is carried out after the initial polishing process for forming grooves on the target surface along the running direction of the substrate. The intermediate layer has an in-plane directionality of 7° or less. The tape-shaped substrate is fabricated by rolling nickel, a nickel alloys or stainless steel.

10 Claims, 18 Drawing Sheets

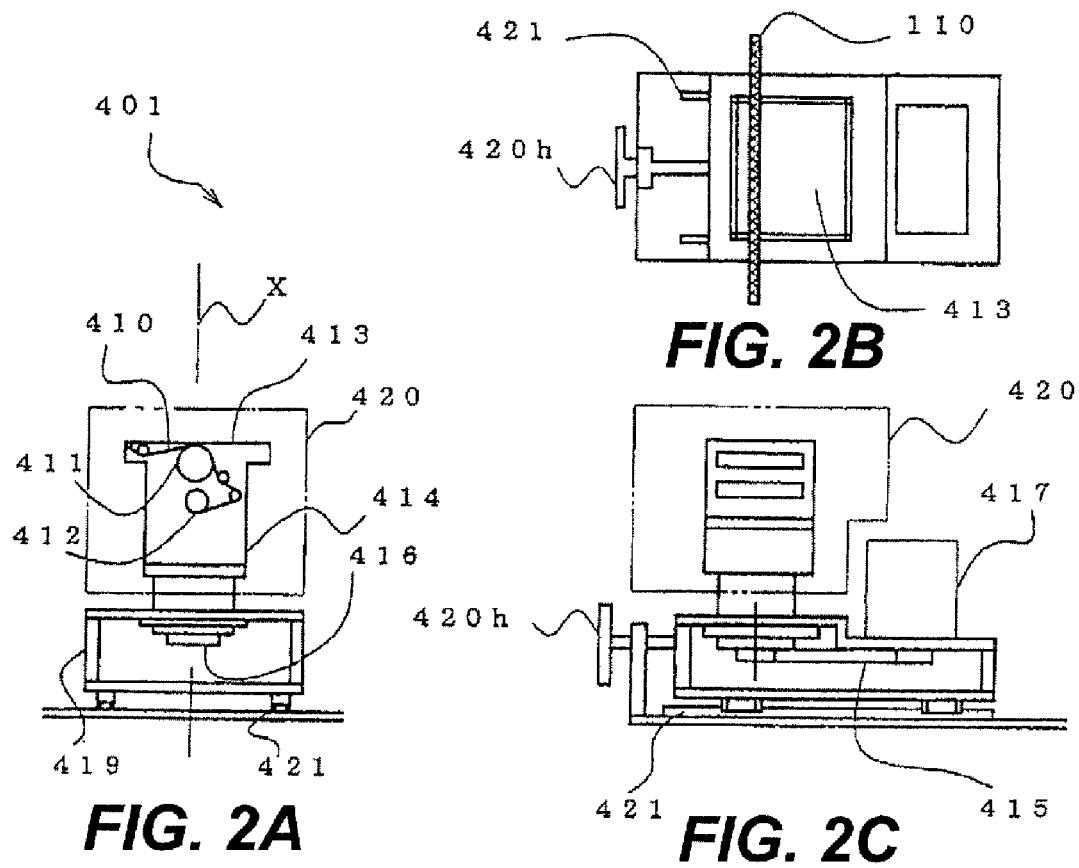
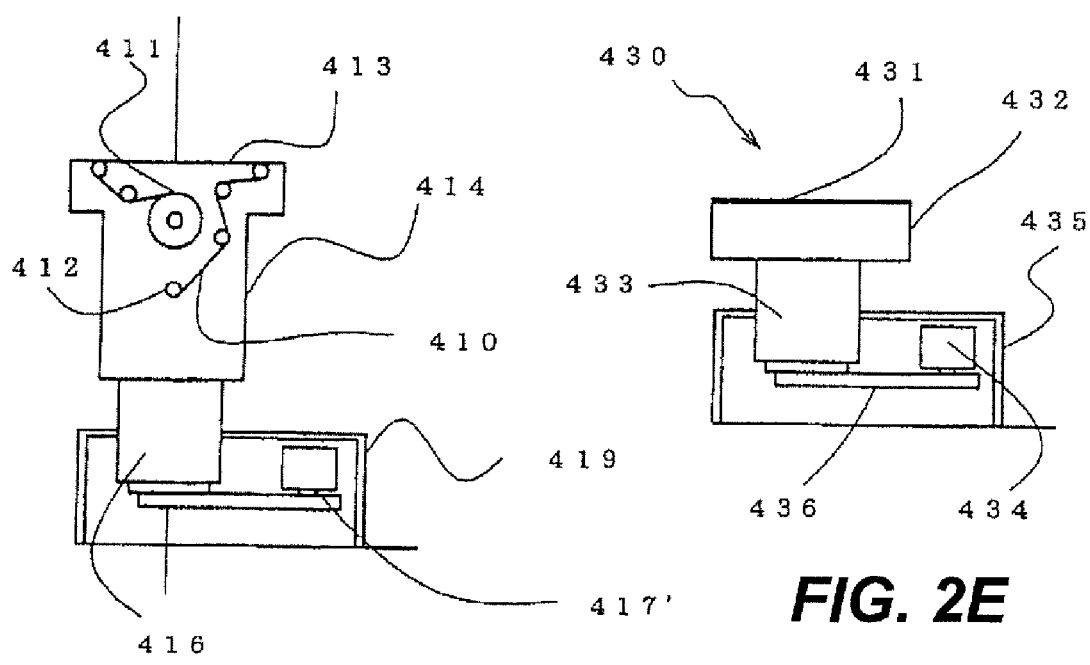

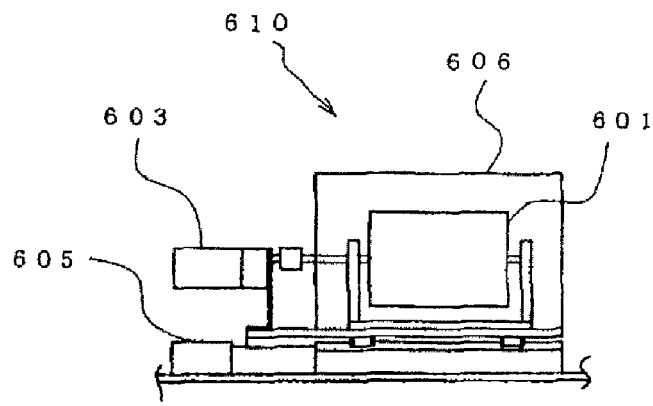 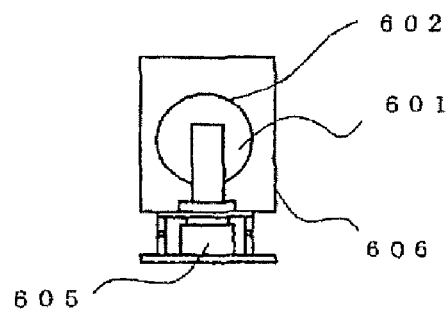
FIG. 4A  FIG. 4B
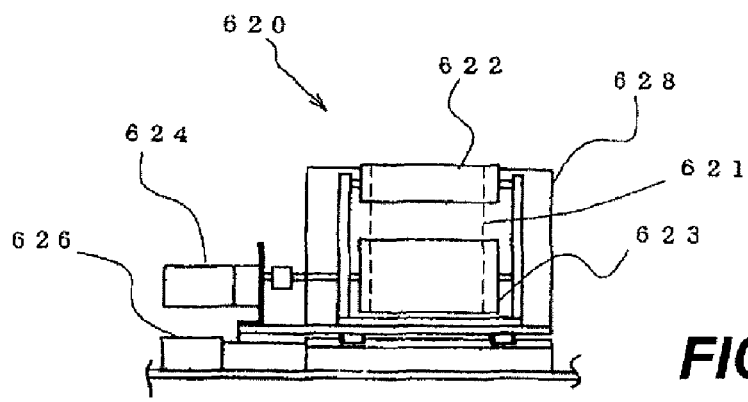
FIG. 5A
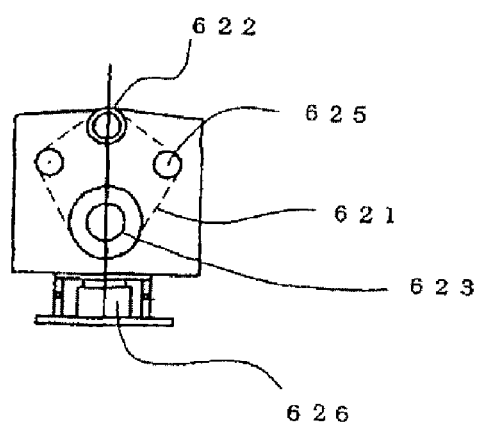
FIG. 5B

METHOD OF POLISHING TAPE-SHAPED SUBSTRATE AND SUBSTRATE FOR OXIDE SUPERCONDUCTOR

This application claims priority on Japanese Patent Application 2007-219072 filed Aug. 24, 2007.

BACKGROUND OF THE INVENTION

This invention relates to a method of polishing the target surface of a tape-shaped base material (or "substrate") for forming an oxide superconductor thin film on such a polished surface, as well as a base material for an oxide superconductor using such a tape-shaped substrate, which has been polished by the method of this invention.

Among superconducting materials, it is known that oxide superconductors are superior superconductors having critical temperatures higher than the liquid nitrogen temperatures. As disclosed in Japanese Patent Publication Tokkai 9-120719, for example, a tape-shaped material obtained by forming a polycrystalline directional film of MgO, yttrium stabilized-zirconia or $CeO_2$ having controlled crystalline directionality as an intermediate layer by an IBAD (ion beam assisted deposition) or PLD (pulsed laser deposition) method on the surface of a Hastelloy alloy tape comprising a nickel alloy and further forming a YBCO ($YBa_2Cu_3O_{7-y}$) oxide superconductor film on this polycrystalline directional film is known as a typical example of oxide superconductor tape-shaped material. In order to provide an oxide superconductor of this kind for a practical use, however, there are still many problems currently remaining to be solved.

As disclosed in Japanese Patent Publications Tokkai 2-207415, 6-145977 and 2003-036742, for example, there have been methods of making the surface of a tape-shaped substrate smoother in order to obtain a higher critical current Ic and a higher critical current density Jc such that a superconductive film with a superior crystalline characteristic can be formed on a tape-shaped substrate.

Moreover, if the directionality of the intermediate layer is improved, the directionality of the superconducting film that is formed thereupon is also improved. In particular, it is considered indispensable to obtain a high biaxial directionality in order to obtain a superconducting film having high critical current Ic and high critical current density Jc.

Since the crystalline characteristic of the intermediate layer to be formed depends on the crystalline characteristic of the surface of the tape-shaped substrate which serves as its base, the crystalline directionality and the in-plane directionality of the tape-shaped substrate become important in order to obtain an intermediate layer with a good directionality. Thus, in order to crystallize the intermediate layer film with a good directionality, it is necessary to finish the surface of the tape-shaped substrate with flatness and smoothness at the nanolevel.

U.S. Pat. No. 6,908,362 has disclosed another method according to which the surface of a tape of nickel or a nickel alloy is precisely polished and thereafter an oxide superconductor film is formed.

Another problem that has been preventing superconductivity from becoming practically usable relates to the behavior of the quantum of magnetic flux. The Lorentz force generated by a current that passes through a superconductor tends to move the magnetic flux quantum but if the magnetic flux quantum moves, heat is generated and breaks down the condition of superconductivity. Thus, the critical current Ic that can be passed through a superconductor can be made larger if the magnetic flux quantum can be pinned down so as not to move.

These prior art technologies described above all indicate the importance of polishing the substrate surface to make it flat and smooth.

A tape-shaped material is usually formed by drawing a metallic material into an elongated tape-like shape with a thickness of 0.05 mm-0.2 mm while repeating rolling and heating processes. On the surface of such an elongated material, there are mechanical linear marks that are formed due to the rolling and changes due to crystalline defects. These linear marks and defects tend to adversely affect the crystalline directionality of the intermediate layer and the superconducting layer that are directly formed thereupon. For this reason, it has been a common practice in the manufacturing of tape-shaped superconductor materials to initially form a flat and smooth surface on the tape-shaped material after the rolling process by mechanical polishing or electrolytic polishing and then to form an intermediate layer and a superconducting layer thereupon, as disclosed, for example, in Japanese Patent Publications Tokkai 6-31604 and 2002-150855.

In the case of a very long tape-shaped substrate, however, it is extremely difficult to polish it to make it flat and smooth over its entire length.

SUMMARY OF THE INVENTION

It is therefore an object of this invention to provide a method of polishing and finishing the surface of a tape-shaped substrate with flatness and smoothness at the nanolevel such that the oxide superconductor obtained by forming such an intermediate layer and an oxide superconductor film layer sequentially on a tape-shaped substrate can have a high critical current (Ic) and a high critical current density (Jc), the intermediate layer and the oxide superconductor film layer being crystallized with improved directionality characteristics.

It is also an object of this invention to provide a substrate for an oxide superconductor comprising such a tape-shaped substrate polished by the method of polishing according to this invention and an intermediate layer formed thereupon.

A method according to this method is for polishing a target surface of a tape-shaped substrate of an oxide superconductor, this superconductor comprising an intermediate layer formed on the tape-shaped substrate and an oxide superconductor thin film, comprises a polishing step of polishing the target surface while causing the tape-shaped substrate to continuously run in a running direction, the polishing step including an initial polishing process and a finishing process that is carried out after the initial polishing process and is characterized wherein grooves parallel to the running direction are formed on the target surface after the polishing step.

As grooves are thus formed in the running direction on the target surface of the tape-shaped substrate after the polishing process of this invention, the crystalline particles of the intermediate layer which is formed inside these grooves are further arranged inside these grooves. As a result, the directionality characteristic of the intermediate layer comes to be further improved, and the crystalline directionality of the oxide superconductor film layer formed on this intermediate layer is also improved. Thus, high biaxial directionality is obtained and an oxide superconductor with a high critical current (Ic) and a high critical current density (Jc) can be provided.

In the description above, the initial polishing process is for carrying out random polishing for finishing the target surface with surface roughness of 5 nm or less, and the finishing process is for forming grooves on the target surface in the running direction. By this random polishing in the initial polishing process, the scratches and the crystalline defects formed on the target surface due to the rolling process on the tape-shaped substrate can be removed. The finishing process is thereafter carried out to form grooves on the target surface in the running direction such that the directionality of the intermediate layer and the oxide superconductor film layer can be improved. In the above and throughout herein, the surface roughness means the so-called RMS surface roughness, or the root mean square of the deviations of the measured curve from its average line.

The aforementioned finishing process is preferably carried out such that the surface roughness of the target surface in the direction of the width (perpendicular to the aforementioned running direction of the tape-shaped substrate) will become 10 nm or less. It is because the directionality of the intermediate layer and the oxide superconductor film layer improves abruptly if the surface roughness is reduced to 10 nm or less.

It is further preferable to carry out the finishing process such that the line density of the grooves formed on the target surface be within the range of 50 line/μm-5 line/μm, the width of the grooves be within the range of 20 nm-200 nm, or more preferably 20 nm-50 nm. With the line density and the widths thus prepared, the diameters of the crystalline particles forming the intermediate layer and the oxide superconductor film layer can be controlled such that a crystalline growth with good directionality can be accelerated. Moreover, the aforementioned directionality can be further improved if the surface roughness inside these grooves is reduced to 1 nm or less.

The aforementioned finishing process may be carried out by using slurry containing polycrystalline diamond and a polishing tape or pad made of a material selected from the group consisting of flocked cloth, raised cloth, woven cloth and non-woven cloth. By such a process, grooves can be formed in the running direction of the tape-shaped substrate on the target surface.

A base material of substrate for an oxide superconductor according to this invention is characterized as comprising a tape-shaped substrate polished by the polishing method as described above and an intermediate layer that is formed on the target surface of the tape-shaped substrate and wherein the in-plane directionality of the intermediate layer is 7° or less.

With a base material according to this invention, comprising such a tape-shaped substrate polished according to this invention and an intermediate layer, the directionality of the intermediate layer is superior and that of the superconducting film formed thereupon is improved. Thus, a high level of biaxial directionality can be obtained by the superconducting film and hence also a high critical current (Ic) and a high critical current density (Jc).

In the above, the tape-shaped substrate may be one fabricated by rolling a material selected from the group consisting of nickel, nickel alloys and stainless steel. An oxide superconductor having a high critical current (Ic) and a high critical current density (Jc) can be provided by using a base material for an oxide superconductor formed by a tape-shaped substrate polished according to this invention and an intermediate layer formed on the target surface of this tape-shaped substrate.

Since grooves parallel to the running direction are formed on the target surface of the tape-shaped substrate by the polishing process according to this invention, the directionality of the intermediate layer that is formed thereupon becomes improved and hence that of the superconducting film formed further thereupon becomes improved. As a result, a high level of biaxial directionality can be obtained in the superconducting film layer and an oxide superconductor having a high critical current (Ic) and a high critical current density (Jc) can be provided.

BRIEF DESCRIPTION OF THE DRAWINGS

FIGS. 2A, 2B and 2C are respectively a front view, a plan view and a side view of a polishing head used in a polishing system for carrying out the polishing method of this invention, FIG. 2D shows another example of polishing head, and FIG. 2E shows still another example of polishing head.

FIGS. 4A and 4B are respectively a front view and a side view of a polishing head which is conveniently usable for the second polishing process for a tape-shaped substrate of this invention FIGS. 5A and 5B are respectively a front view and a side view of another polishing head that may be used for the second polishing process for a tape-shaped substrate of this invention.

DETAILED DESCRIPTION OF THE INVENTION

Figure 1:
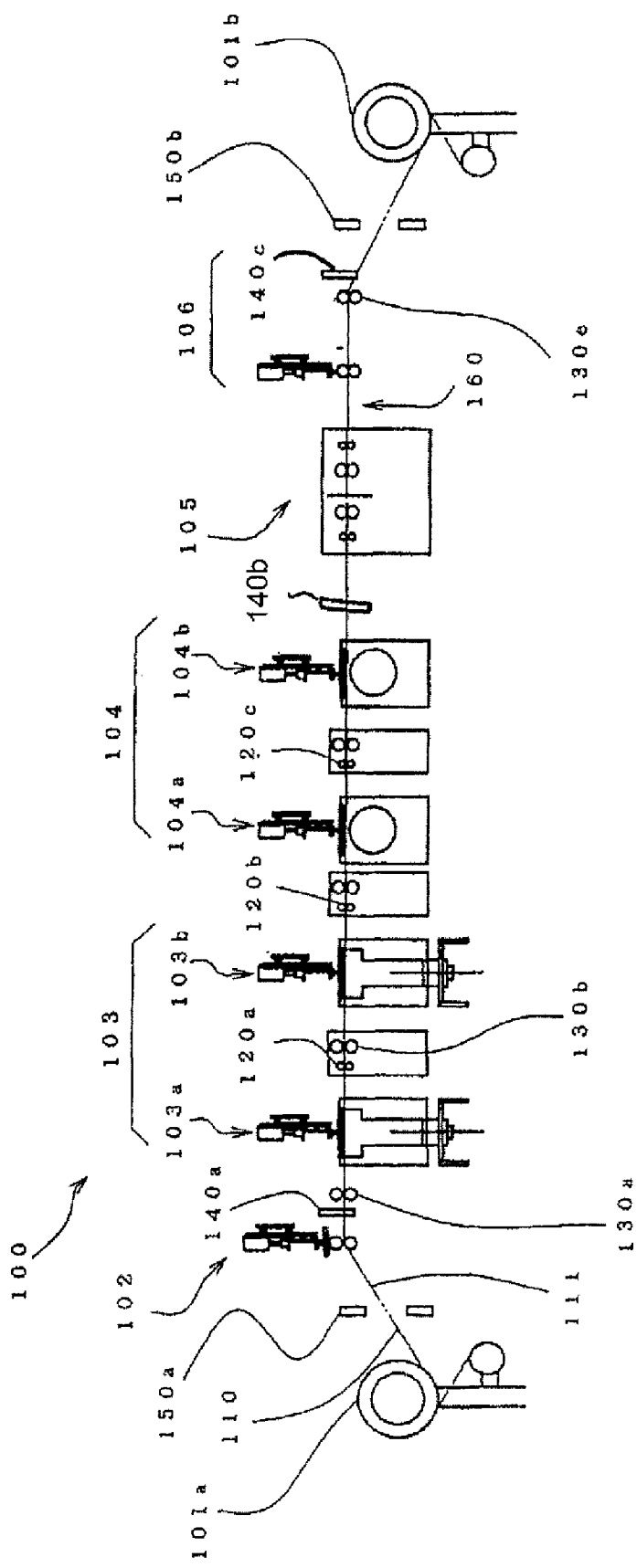
FIG. 1 is a schematic diagram of an example of polishing system for carrying out a polishing method of this invention for a tape-shaped substrate.

The invention is described next in detail with reference to the drawings but the embodiments that are described are not intended to limit the scope of the invention.

This invention relates to an oxide superconductor comprised of a tape-shaped substrate, an intermediate layer formed on this tape-shaped substrate and an oxide superconductor thin film formed on this intermediate layer and a method of polishing a target surface of this tape-shaped substrate, by carrying out an initial polishing process and a finishing process while continuously running the tape-shaped substrate so as to form grooves on the target surface parallel to the direction of the running (or the current direction).

This final polishing process is carried out such that the number of the grooves thus formed will be within the range of 50-5 lines/μm, the RMS surface roughness of the target surface in the direction perpendicular to the grooves will be 10 nm or less, the roughness on the inner surface of the grooves will be 1 nm of less, and the in-plane directionality $\Delta\phi$ of the intermediate layer formed thereupon will be 7° or less.

The initial polishing comprises at least a "first polishing process" of at least one step for carrying out a random polishing process (by a rotary method) on the target surface of the tape-shaped substrate, and the finishing process comprises a "second polishing process" of at least one step for carrying out a polishing process in the running direction of the target surface of the tape-shaped substrate.

In the above, tape-shaped metallic substrates of pure Ni, a Ni-based alloy such as Ni—Cr and Ni—W, pure Cu, a Cu-based alloy such as Cu—Ni or a Fe-based alloy such as Fe—Si and stainless steel that are superior in resistance against high temperatures and corrosion may be used. More specifically, Hastelloy (registered trademark), INCONEL (registered trademark), and Ni alloys such as Ni-5% W that are superior in anti-corrosiveness and resistance against heat are usable. Such substrate materials are fabricated by a rolling technology into a thickness of 0.05 mm-0.5 mm, a width of 2 mm-100 mm and a length of several hundred meters.

Most of such tape-shaped substrates have linear scratches in the direction of the rolling and crystalline defects formed thereupon. According to this invention, the scratches on the surface formed by the rolling, the oxide layer and the crystalline defects are firstly removed by the random rotary polishing method as the initial polishing and the final finishing is thereafter carried out as the finishing process such that grooves will remain in the running direction of the tape-shaped substrate (or the current direction). An oxide superconductor with a high critical current can be formed still thereafter by causing an intermediate layer film and a superconducting film to be sequentially formed on the target surface which has been washed and dried.

The principal object of the first polishing process which comprises the initial polishing process is to remove the marks, oxide films, defects, etc. generated on the tape-shaped metallic substrate by the rolling process. The RMS surface roughness of the tape-shaped substrate after going through the first polishing process is 10 nm or less, and preferably 5 nm or less. Thus, if the initial surface condition was such that the surface roughness was less than this range, the first polishing process may be dispensed with.

The second polishing process is for the finishing process and its object is to polish the target surface such that grooves will be left thereupon in the running direction of the tape-shaped substrate and that an intermediate layer film with superior in-plane directionality can be formed along these grooves.

The RMS surface roughness of the tape-shaped substrate after having been subjected to the second polishing process is 10 nm or less and the density of the grooves is 50 line/μm-5 line/μm. The width of the grooves is within the range of about 20 nm-200 nm, or preferably 20 nm-50 nm, and the surface roughness inside the grooves is 1 nm or less.

The width of the grooves is selected according to the crystalline particle diameters of the intermediate layer film and the superconducting film such that a width suitable to the crystalline directionality can be obtained. The grooves in the running direction need not be formed in a continuous manner.

FIG. 1 is a schematic diagram of an example of polishing system 100 for polishing a tape-shaped substrate for an oxide superconductor of this invention. The polishing system 100 comprises principally a feeding part 101*a*, a back tension part 102, a first polishing part 103 for carrying out the initial polishing process, a second polishing part 104 for carrying out the finishing process, a washing part 105, an inspection part 160 and a workpiece feeder driving part 106 and a wind-up part 101*b*.

A tape-shaped metallic substrate 110 wound around a feeder roller of the feeding part 101*a* is adapted to pass through the back tension part 102 into the first polishing part 103 where the first polishing process is carried out on the tape-shaped substrate 110, as will be explained in detail below. Next, the tape-shaped substrate 110 is advanced to the second polishing part 104 where the second polishing process is carried out on the tape-shaped substrate 110, as will be explained also in detail below. Thereafter, the tape-shaped substrate 110 is delivered into the washing part 105 where a final washing process is carried out. The tape-shaped substrate 110 thus finished is then inspected for RMS surface roughness and polishing marks at the inspection part 160 to be explained in detail below. Thereafter, the tape-shaped substrate 110 is passed through the workpiece feeder driving part 106 and is finally wound up around a wind-up roller of the wind-up part 101*b*.

It is preferable to wash the tape-shaped substrate 110 (as shown at 120*a*, 120*b* and 120*c*) after each polishing process so as to remove residual abrading particles, polishing debris and residual slurry.

As will be explained in detail below, the transport of the tape-shaped substrate is controlled by the back tension part 102 and the workpiece feeder driving part 106 such that a specified tension is maintained. In order to prevent positional displacements of the tape-shaped substrate, furthermore, a plurality of restraining guides 140*a*, 140*b* and 140*c* are set at appropriate intervals. In addition, slackness-detecting sensors 150*a* and 150*b* are disposed on the downstream side of the feeder roller and the upstream side of the wind-up roller such that slackness in the tape-shaped substrate 110 can be detected and that the rotational speed of the wind-up roller can be controlled accordingly.

With a specified tension applied thereto, the tape-shaped metallic substrate 110 is subjected to the first polishing process in the first polishing part 103. Although the polishing system 100 of FIG. 1 is described such that the lower surface 111 of the tape-shaped metallic substrate 110 is to be polished, this is not intended to limit the scope of the invention. Another system may well be structured so as to polish the upper surface of the tape-shaped metallic substrate.

The first polishing part 103 comprises at least one polishing station (103*a* and 103*b*) each comprising a polishing head 401 and a pressing mechanism 440, and at least one washing device (120*a* and 120*b*) disposed on the downstream side of the polishing station.

FIGS. 2A, 2B and 2C are respectively a front view, a plan view and a side view of a polishing head 401 comprising a feeder mechanism for sending a polishing tape 410 onto a polishing table 413 and a rotary mechanism for rotating the polishing table 413 around an axial line X perpendicular to the polishing table 413.

The feeder mechanism comprises a feeder roller 411 around which the polishing tape 410 is wound, at least one support roller, a wind-up roller 412 for winding up the polishing tape after the polishing, and a driver motor (now shown) which is dynamically connected to the feeder roller 411 and the wind-up roller 412. All these components are contained inside a housing 414. The housing 414 is surrounded by a cover 420 for preventing slurry from becoming scattered around during the polishing. As the driver motor is operated, the polishing tape 410 is delivered from the feeder roller 411, passes on the polishing table 413 through the support roller and is finally wound up by the wind-up roller 412.

A woven cloth, a non-woven cloth, a flocked cloth and a raised cloth made of foamed urethane, suede, polyester or nylon may be used as the polishing tape 410.

An unused portion of the polishing tape 410 is constantly delivered onto the polishing table 413 for polishing the target surface of the tape-shaped metallic substrate 110. It is preferable to supply aforementioned slurry for the polishing. The slurry may preferably comprise abrading particles, water and a mixture of water and an additive (such as a lubricant and a dispersant for the abrading particles). Examples of the abrading particles include particles of diamond (monocrystalline and polycrystalline), silica (colloidal silica and fumed silica), alumina, SiC and cBN, without being limited thereby.

The average diameter of the abrading particles in the slurry is preferably 5 µm-0.02 µm for the first initial polishing process for the first polishing process. For the second polishing process which is the finishing process, a particle diameter suitable to the width of the grooves to be formed in the running direction is selected. In other words, a selection is made appropriately according to the width of the grooves and their line density. The range may be conveniently 10 µm-0.1 µm. It is also possible to provide a plurality of polishing devices for each polishing process and to vary the particle diameters for each. It is also possible to use abrading particles of the same diameters and to continue the polishing process. This can serve to reduce the time required for the polishing the target surface.

As shown in FIGS. 2A and 2C, the rotary mechanism is below the housing 414, comprising a spindle 416 connected coaxially to the axial line X of the polishing table 413 and a belt 415 for transmitting the rotary power of a motor 417 to the spindle 416. There is also included a supporting table 419 for supporting the motor 417 and the housing 414.

The spindle 416 is inside the supporting table 419 and is rotatably attached thereto. The supporting table 419 is carried on two rails 421, and a handle 420*h* for moving the polishing station along the rails 421 is provided to the supporting table 419.

As the motor 417 is operated, its rotary power is transmitted through the belt 415 to the spindle 416 and the housing 414 is rotated around the axial line X. It is also possible to provide a plurality of polishing stations. In such a case, the efficiency of polishing can be improved by causing the housings to rotate in different directions (or by varying the directions of rotations of the polishing tapes). It is also possible to vary the characteristics of the target polished surface by reversing the direction of rotation between the first and second polishing processes.

FIG. 2D shows a variation of the first polishing process, with a motor 417' contained inside the supporting table 419.

FIG. 2E shows another example of polishing head, using a polishing pad 431, instead of a polishing tape, for polishing the tape-shaped substrate 110. The polishing head 430 comprises a platen 432 having the polishing pad 431 pasted thereto, a spindle 433 supporting the platen 432, a belt 436 and a motor 434. The spindle 433 is rotatably attached to a supporting table 435 and the motor 434 is contained inside this supporting table 435. As the motor 434 is operated, its rotary power is transmitted through the belt 436 to the spindle 433, rotating the polishing pad 431 and thereby polishing the tape-shaped substrate 110. It is preferable to supply the aforementioned slurry approximately to the center of the polishing pad 431 at the time of polishing.

Figure 3A:
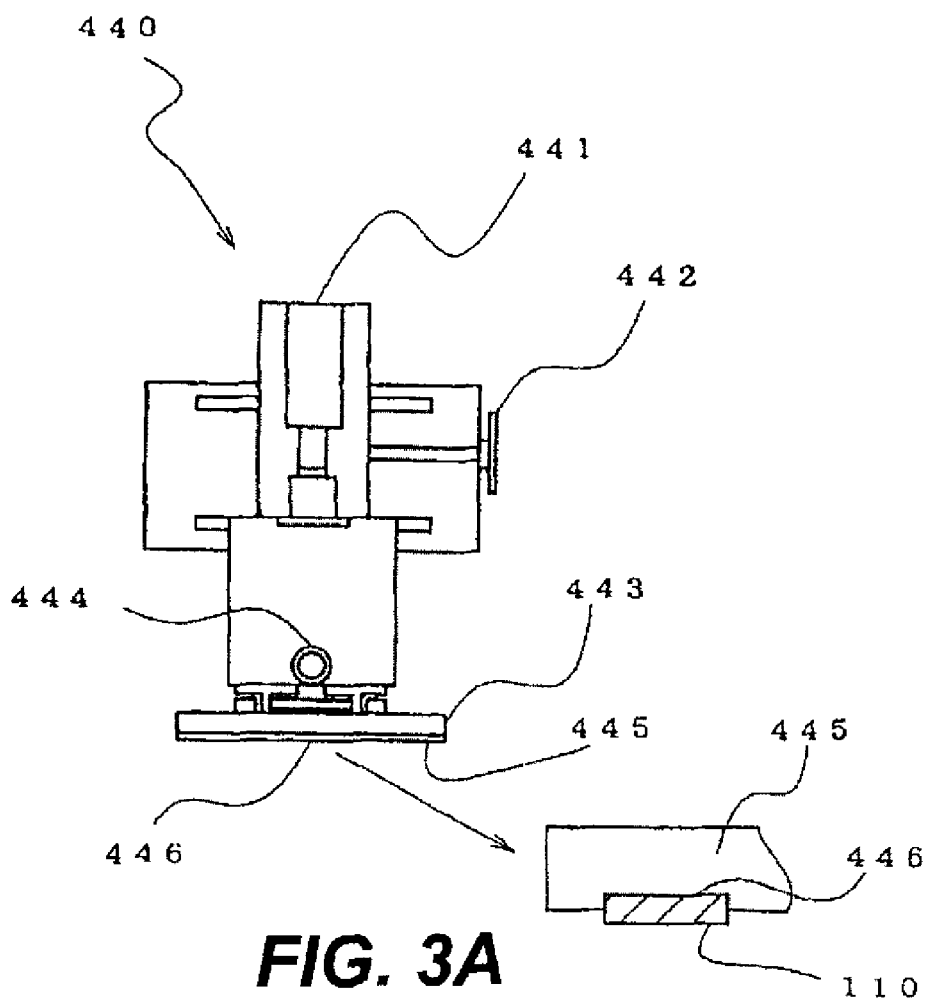
FIGS. 3A and 3B are respectively a front view and a side view of the pressing mechanism used in the polishing system of this invention.
Figure 3B:
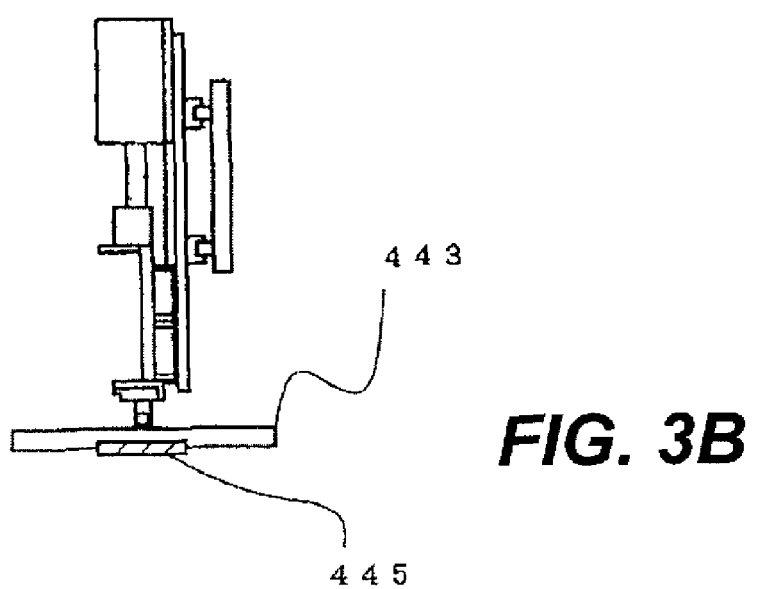

Next, the pressing mechanism 440 is explained. FIGS. 3A and 3B are respectively a front view and a side view of the pressing mechanism 440 used in the polishing system of this invention, comprising an air cylinder 441, a pressing plate 443, and a holding plate 445 disposed on the central line of the pressing plate 443 along the running direction of the tape-shaped substrate. The lower surface of the holding plate 445 is provided with a guide groove 446 corresponding to the width of the tape-shaped substrate 110 for preventing positional displacements of the tape-shaped substrate 110 during the polishing. The holding plate 445 may be appropriately exchangeable, depending on the size (width and thickness) of the tape-shaped metallic substrate 110.

A handle 442 for adjusting the position is provided to the side surface of the pressing mechanism 440 such that the center in the direction of the width of the tape-shaped metallic substrate 110 will be adjusted to match the center of the pressing mechanism 440. In this manner, the pressure from the air cylinder 441 can be properly transmitted through the pressing plate 443 and the holding plate 445 onto the tape-shaped substrate 110. An adjustment screw 444 is further provided to the top of the pressing plate 443. Prior to the polishing process, this adjustment screw 444 is used to adjust the parallel relationship between the pressing plate 443 and the polishing tape 413. It now goes without saying that the embodiment illustrated herein is not intended to limit the scope of the invention. Any other kind of pressing mechanism may be used for the purpose of this invention.

FIGS. 4A and 4B are respectively a front view and a side view of a polishing head 610 which is conveniently usable for the second polishing process for a tape-shaped substrate of this invention, comprising a cylindrical drum 601 formed, for example, by winding a resin sheet 602 around a cylindrical drum base made of stainless steel, a driver motor 603 for rotating the cylindrical drum 601 and a driving mechanism (not shown) such as a driver ring.

In the above, the resin sheet 602 may comprise foamed polyurethane, woven cloth, non-woven cloth or flocked cloth. The cylindrical drum 601 is contained inside a housing 606. Another motor 605 for oscillating the cylindrical drum 601 in a direction perpendicular to the running direction of the tape-shaped substrate 110 may also be provided. By such an oscillatory motion, the tape-shaped metallic substrate 110 can be prevented from being polished at the same place on the cylindrical drum 601.

In the case of the polishing in the second step (the final finishing process), it is possible to polish without the oscillatory motion in order to form the grooves only in one direction. At the time of the polishing, it is preferable to supply aforementioned slurry on the resin sheet 602.

FIGS. 5A and 5B are respectively a front view and a side view of another polishing head 620 that may be used for the second polishing process for a tape-shaped substrate of this invention, comprising a contact roller 622 for pressing a polishing belt 621 onto the tape-shaped substrate 110, a belt driving means 623, supporting rollers 625 and a driver motor 624 connected to the belt driving means 623.

The contact roller 622, the supporting rollers 625 and the belt driving means 623 are contained inside a housing 628. A tape made of a woven or non-woven cloth of synthetic fibers or a foamed member may be used as the polishing tape 621.

As the driver motor 624 is operated, the polishing belt 621 is run by the belt driving means 623 through the contact roller 622 and the supporting rollers 625 and polishes the target surface of the tape-shaped substrate 110. At the time of the polishing, it is preferable to supply aforementioned slurry onto the polishing belt 621.

Additionally, there may also be provided another motor 626 for oscillating the contact roller 622 in a direction perpendicular to the running direction of the tape-shaped substrate 110. Such an oscillatory motion can prevent the tape-shaped metallic substrate 110 from being polished at the same position on the polishing belt 621.

In the case of the final finishing process, it is normally preferable not to carry out this oscillation for the purpose of forming the grooves in an accurate manner.

The polishing heads 610 and 620 described above are characterized in that the polishing surface of the cylindrical drum 601 and the polishing belt 621 rotate in or opposite to the running direction of the tape-shaped substrate 110. Both polishing heads 610 and 620 serve to form the polishing station together with the pressing mechanism 440 explained above with reference to FIG. 3. A plurality of polishing stations may be arranged in series for the second polishing process. In this situation, it is preferable to place a washing device described above on the downstream side of each polishing station.

In the second polishing part 104, the tape-shaped metallic substrate 110 is subjected to the second polishing process. In the example of the polishing system shown in FIG. 1, the second polishing process is carried out by the polishing method in two steps in the running direction. It is preferable to use slurry with abrading particles, water and a mixture of water and additive (such as a lubricant and a dispersant for the abrading particles) at the time of polishing. Use as abrading particles may be made of $SiO_2$, $Al_2O_3$, diamond, cBN, SiC and colloidal silica, although it is not so limited. Spherically shaped polycrystalline diamond is suited as a preferable example such that the interior of the grooves in the running direction will become smooth. The average diameter of the abrading particles to be used is 0.05 µm-10 µm, and more preferably 0.1 µm-5 µm.

The polishing system can incorporate suitable polishing programs by changing combinations of different devices according to the polishing conditions. If a plurality of steps are provided for each polishing process, for example, the polishing conditions of each step (such as the rotational speed of the polishing head and the diameter of the abrading particles of slurry) may be appropriately adjusted.

As described above, the first polishing process according to the polishing method for a tape-shaped substrate for an oxide superconductor of this invention is a preparatory process for carrying out the second of the polishing processes and comprises processes for polishing the target surface of the tape-shaped substrate such that its RMS surface roughness will become 10 nm or less, or preferably 5 nm or less.

As further described above, the second polishing process according to the polishing method for a tape-shaped substrate for an oxide superconductor of this invention is for polishing so as to form grooves in the running direction of the tape-shaped substrate (or the current direction) such that its RMS surface roughness will become 10 nm or less and that the density of the grooves will become 50 lines/µm-5 lines/µm.

Preferably, the first polishing process is an ordinary random polishing process, while the final finishing by the second polishing process is carried out such that grooves are formed on the target surface along the running direction of the tape-shaped substrate.

An intermediate layer is formed on the surface of the tape-shaped substrate thus obtained. A film of MaO, $CeO_2$, $SrTiO_3$ or zirconia stabilized by $Y_2O_3$ (YSZ) is vapor-deposited as an intermediate layer having in-plane biaxial directionality by the IBAD (Ion beam Assisted Deposition) method or the ISD (Inclined Substrate Deposition) method. An oxide superconductor film is vapor-deposited on top of the intermediate layer. In this way, the tape-shaped substrate and the intermediate layer become the substrate for the oxide superconductor film. This invention makes it possible to form an intermediate layer with superior crystalline directionality and hence to form a superconducting thin film with a high critical current.

TEST EXAMPLES

Experiments have been carried out by polishing tape-shaped substrates under various research conditions and investigating the directionality of the intermediate layers vapor-deposited thereupon. These experiments will be described in what follows.

A continuous polishing system shown in FIG. 1 was used as the polishing device. Each of the polishing processes was carried out according to polishing programs both as a single step and in a plurality of steps. In cases of a plurality of steps, the particle size of the slurry was varied from fine ones to rough ones and the mode of polishing was appropriately varied between random polishing and polishing in the running direction (or the current direction).

Figure 6:
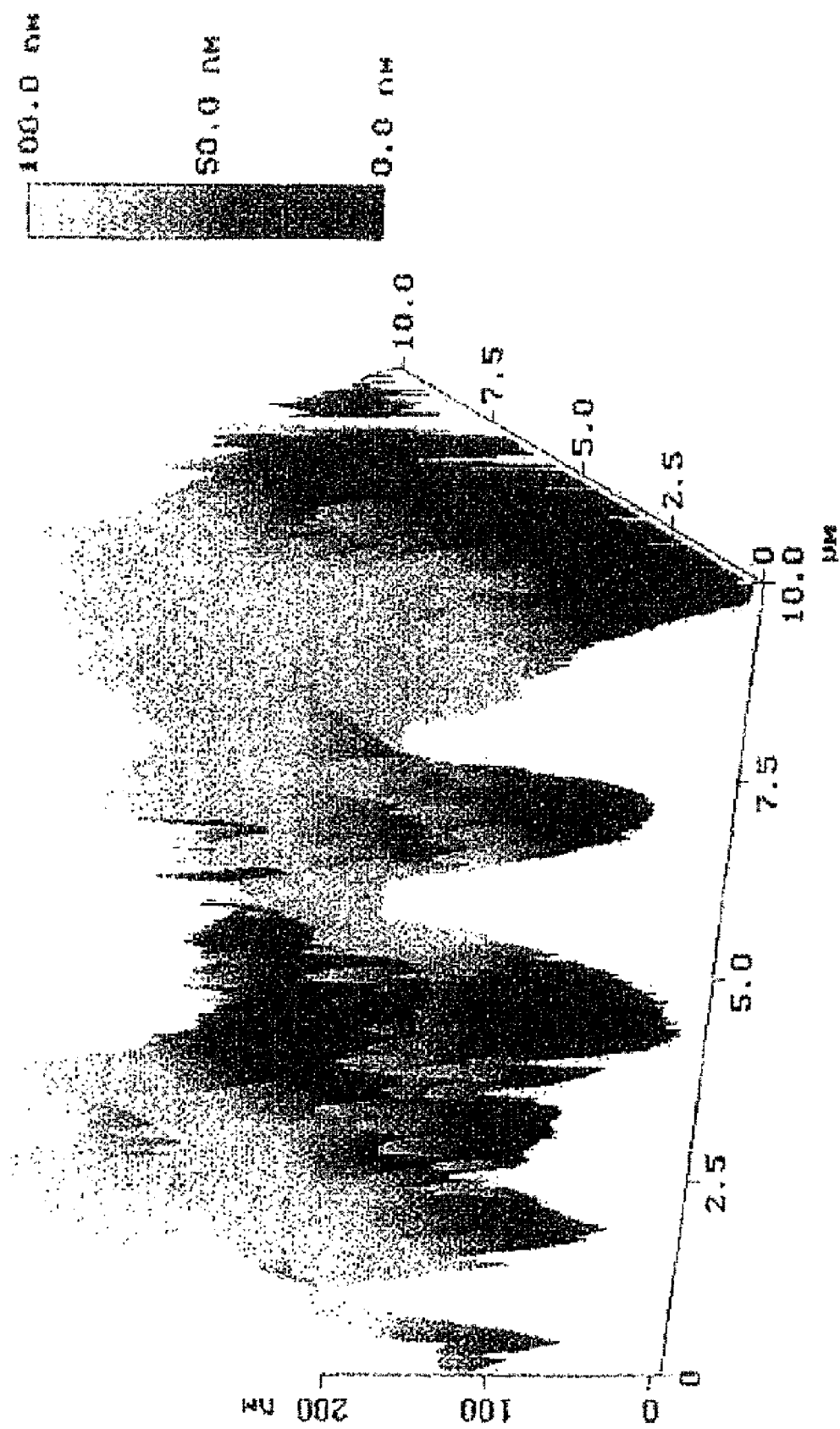
FIG. 6 is a computer image photographs (AFM) of the surface of a tape-shaped substrate before being polished.
Figure 7:
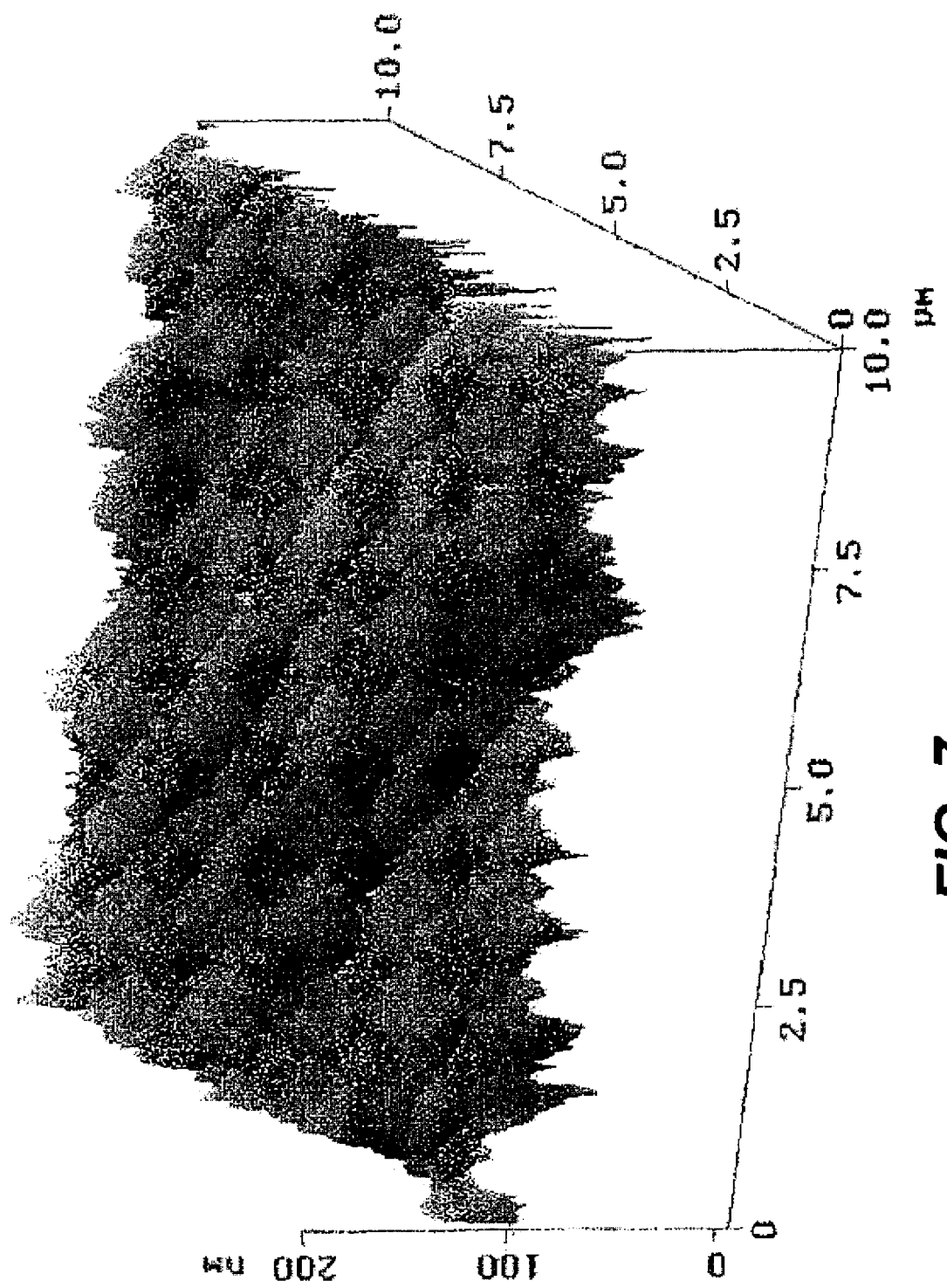
FIG. 7 is a computer image photographs (AFM) of the surface of the tape-shaped substrate of Comparison Example 1 after being polished.
Figure 8:
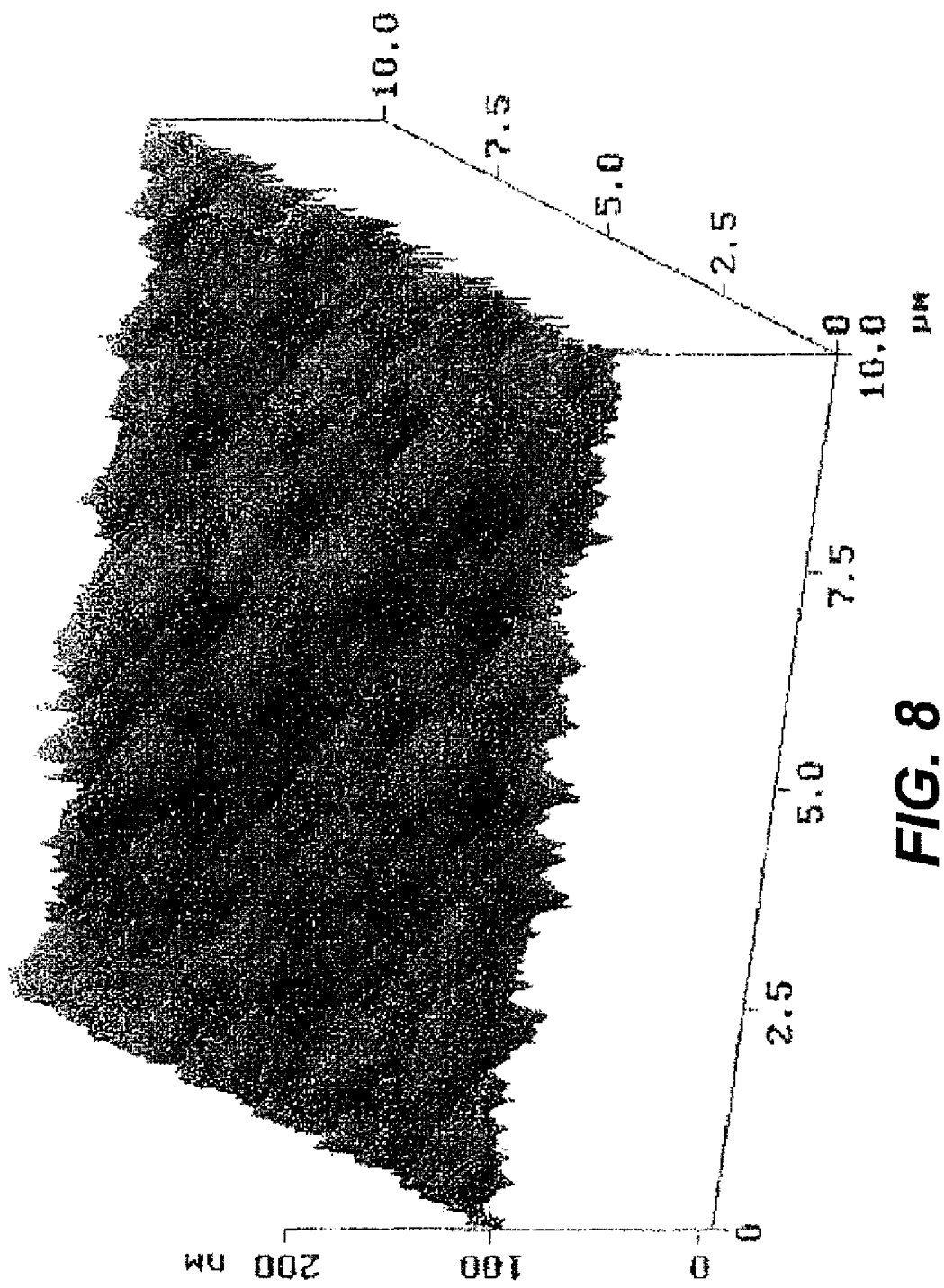
FIG. 8 is a computer image photographs (AFM) of the surface of the tape-shaped substrate of Comparison Example 2 after being polished.
Figure 9:
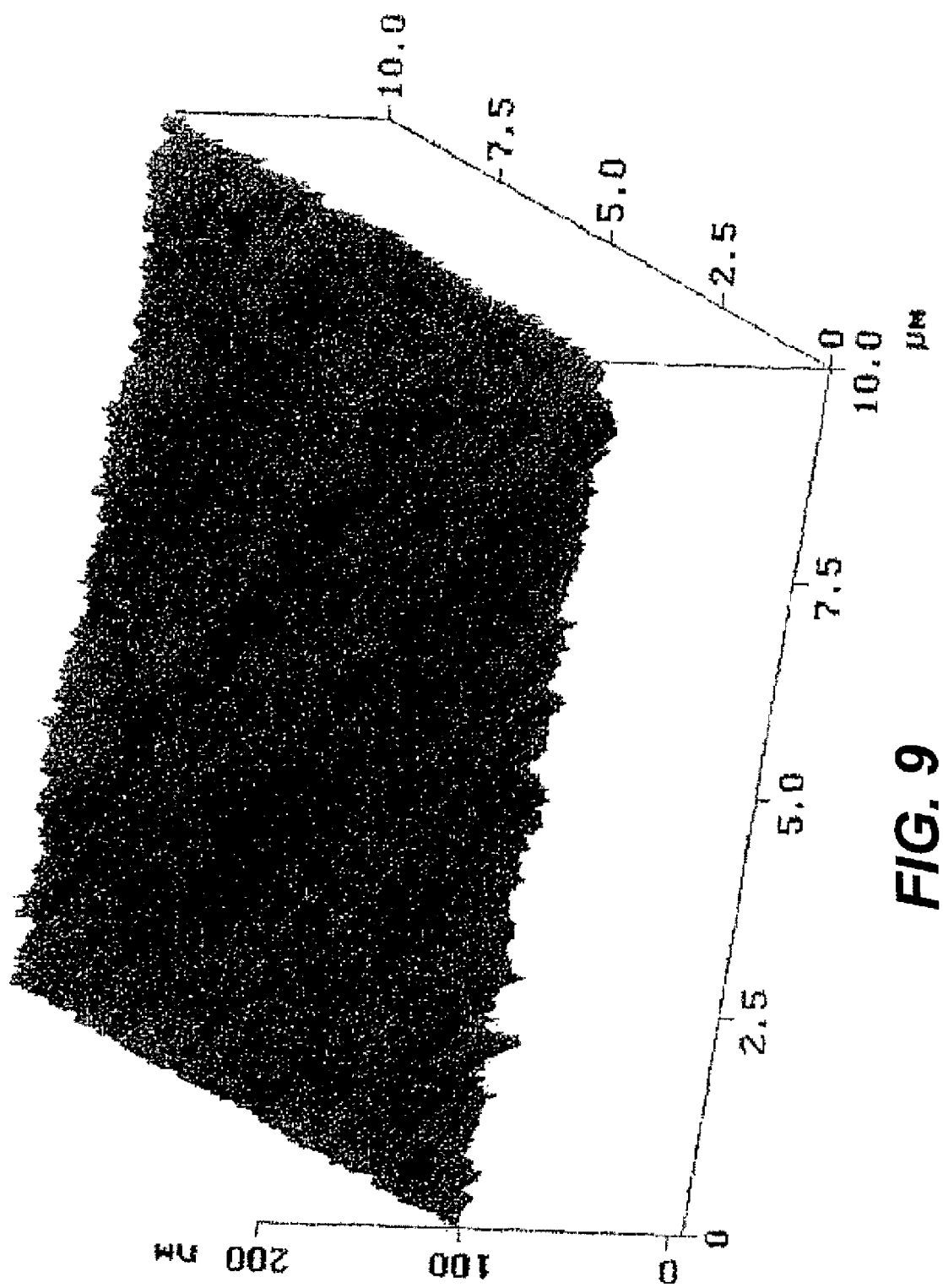
FIG. 9 is a computer image photographs (AFM) of the surface of the tape-shaped substrate of Comparison Example 3 after being polished.
Figure 10:
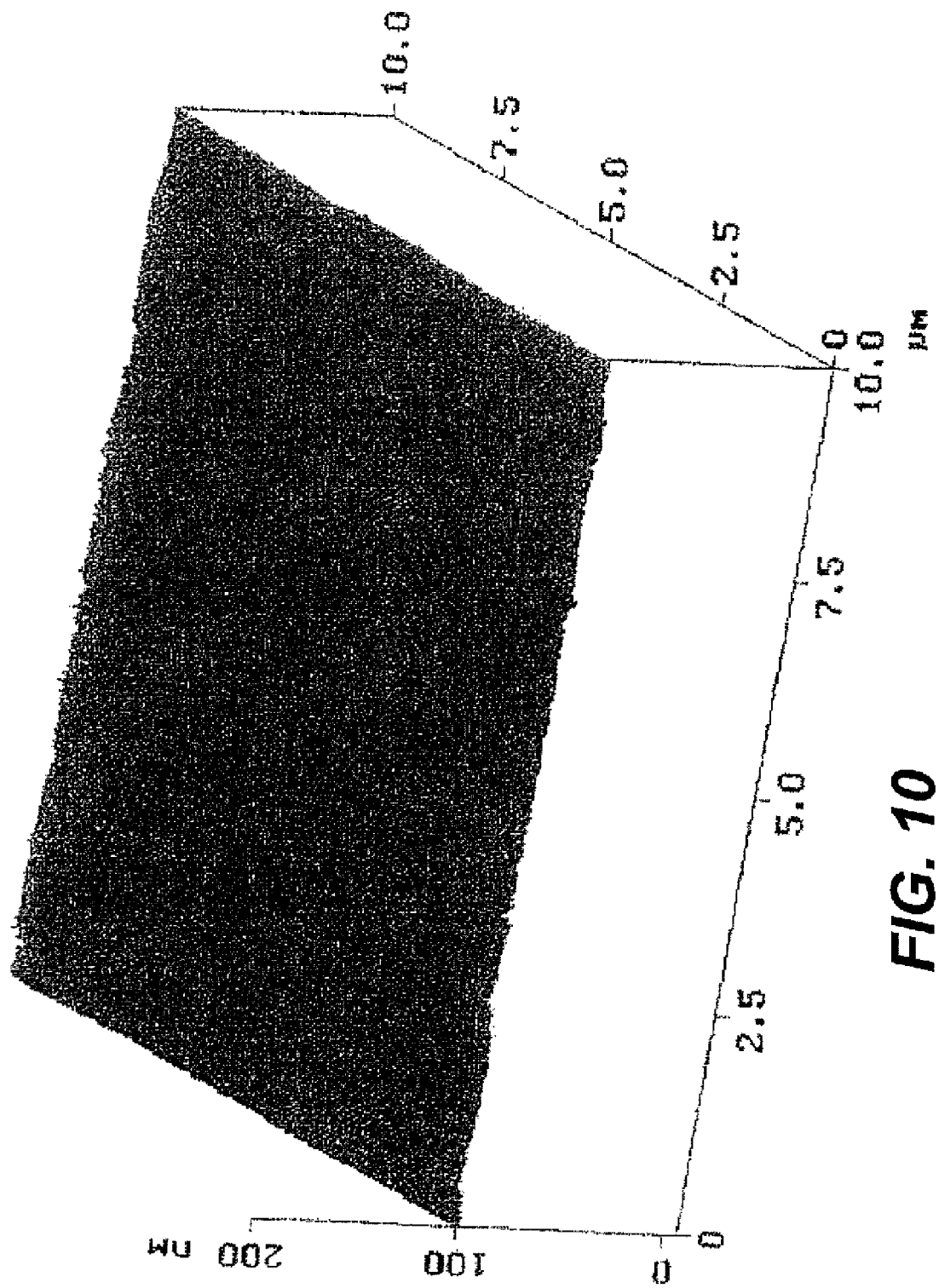
FIG. 10 is a computer image photographs (AFM) of the surface of the tape-shaped substrate of Comparison Example 4 after being polished.
Figure 11:
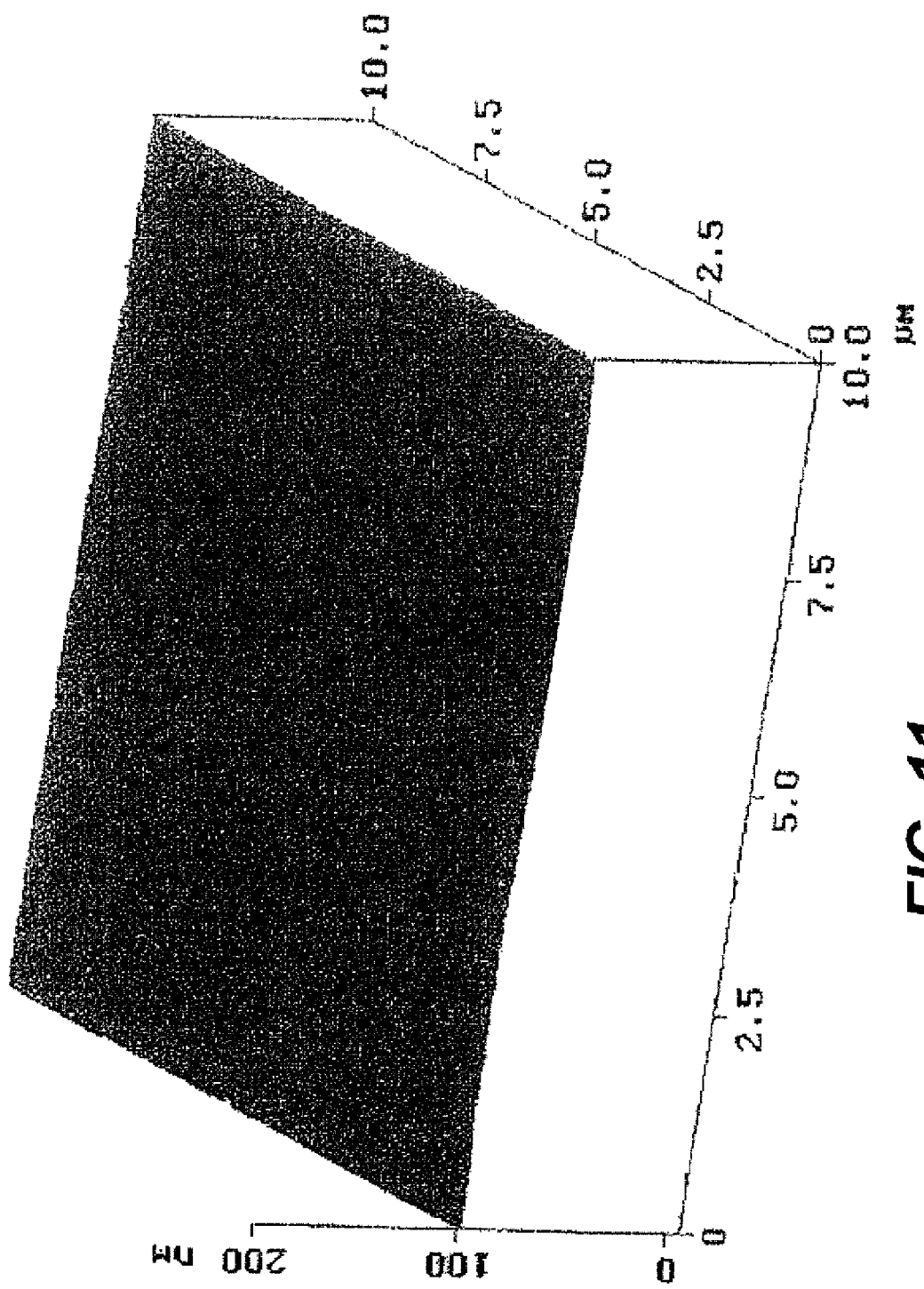
FIG. 11 is a computer image photographs (AFM) of the surface of the tape-shaped substrate of Comparison Example 5 after being polished.
Figure 12:
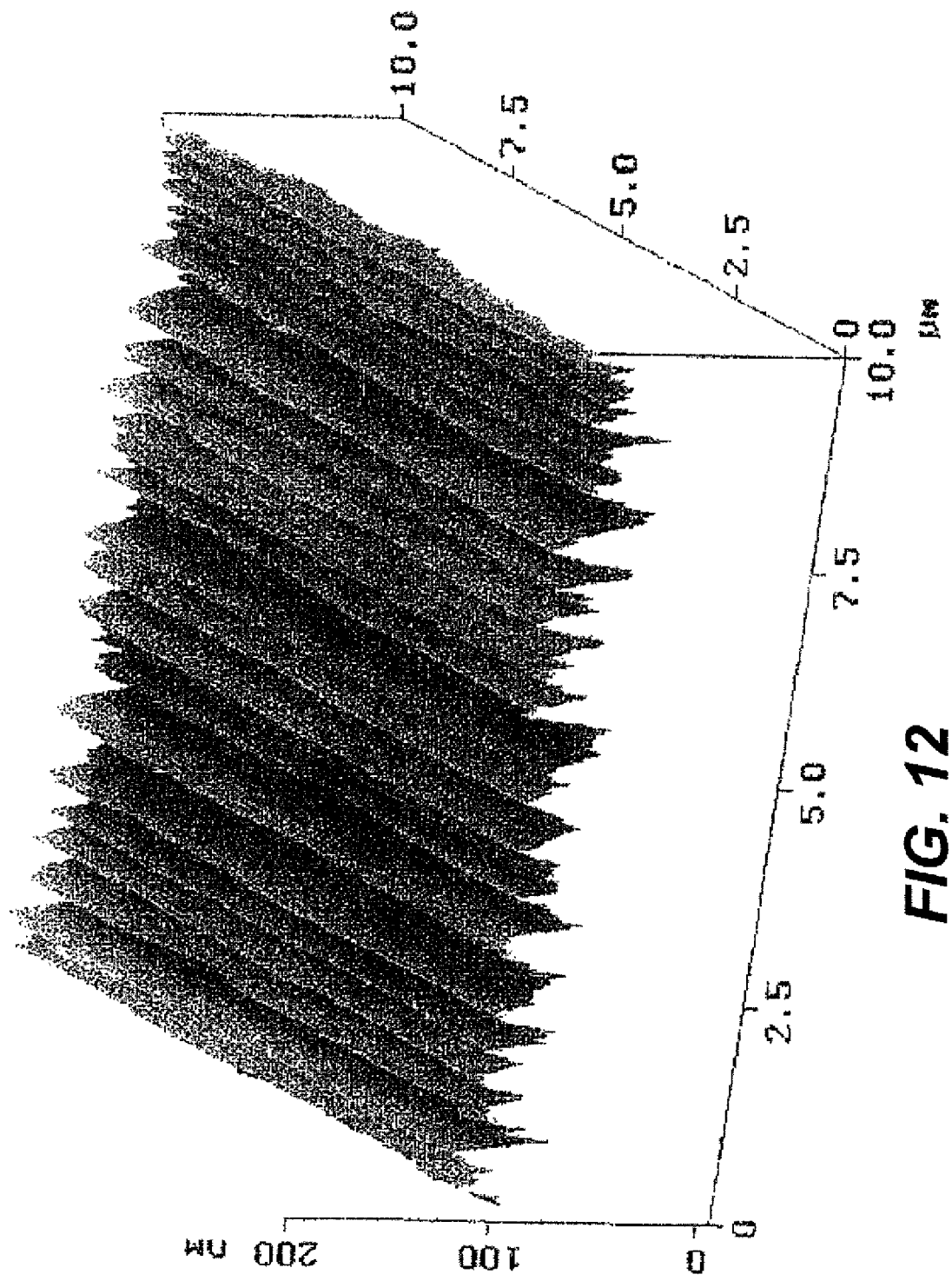
FIG. 12 is a computer image photographs (AFM) of the surface of the tape-shaped substrate of Test Example 1 after being polished.
Figure 13:
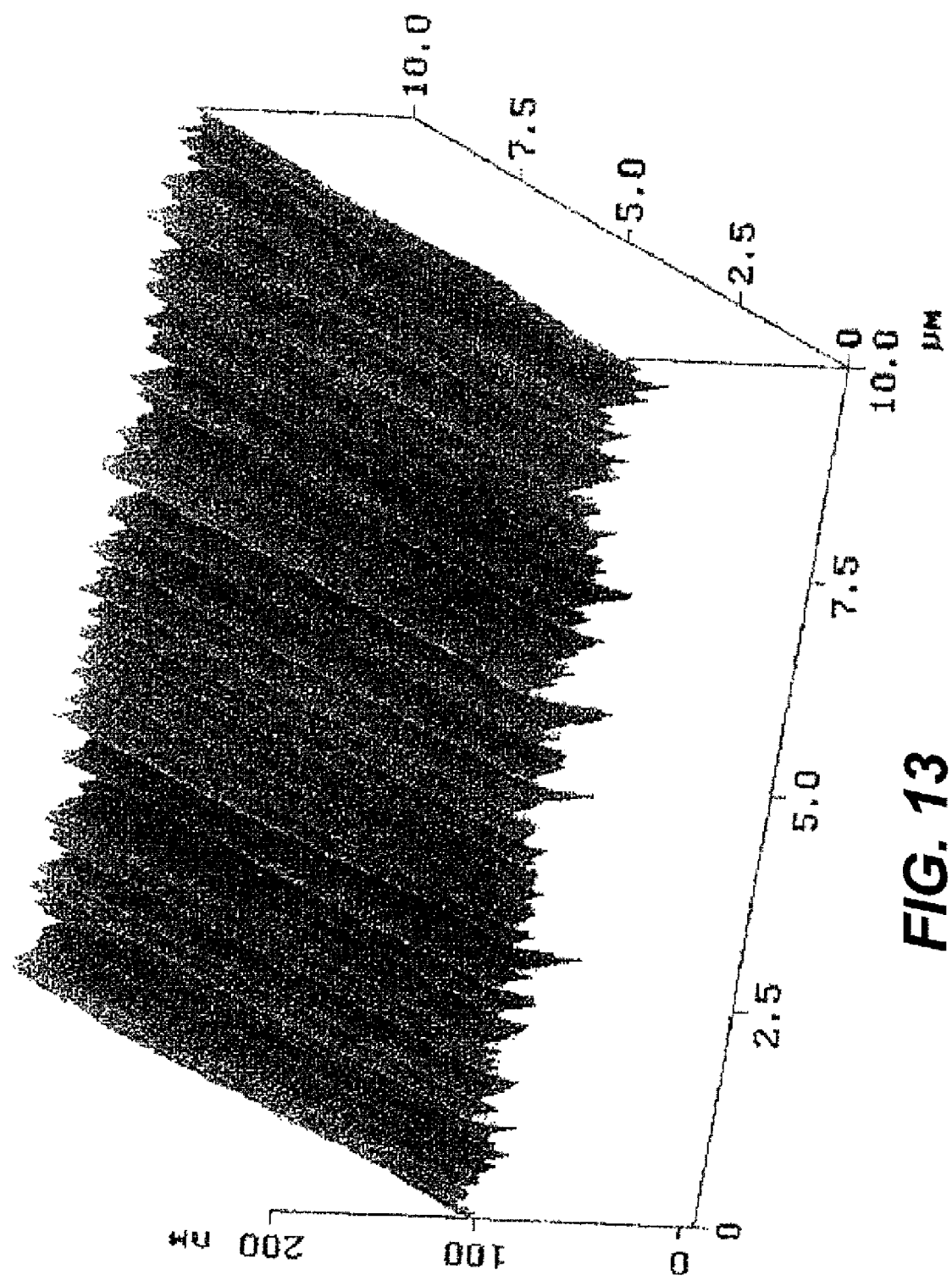
FIG. 13 is a computer image photographs (AFM) of the surface of the tape-shaped substrate of Test Example 2 after being polished.
Figure 14:
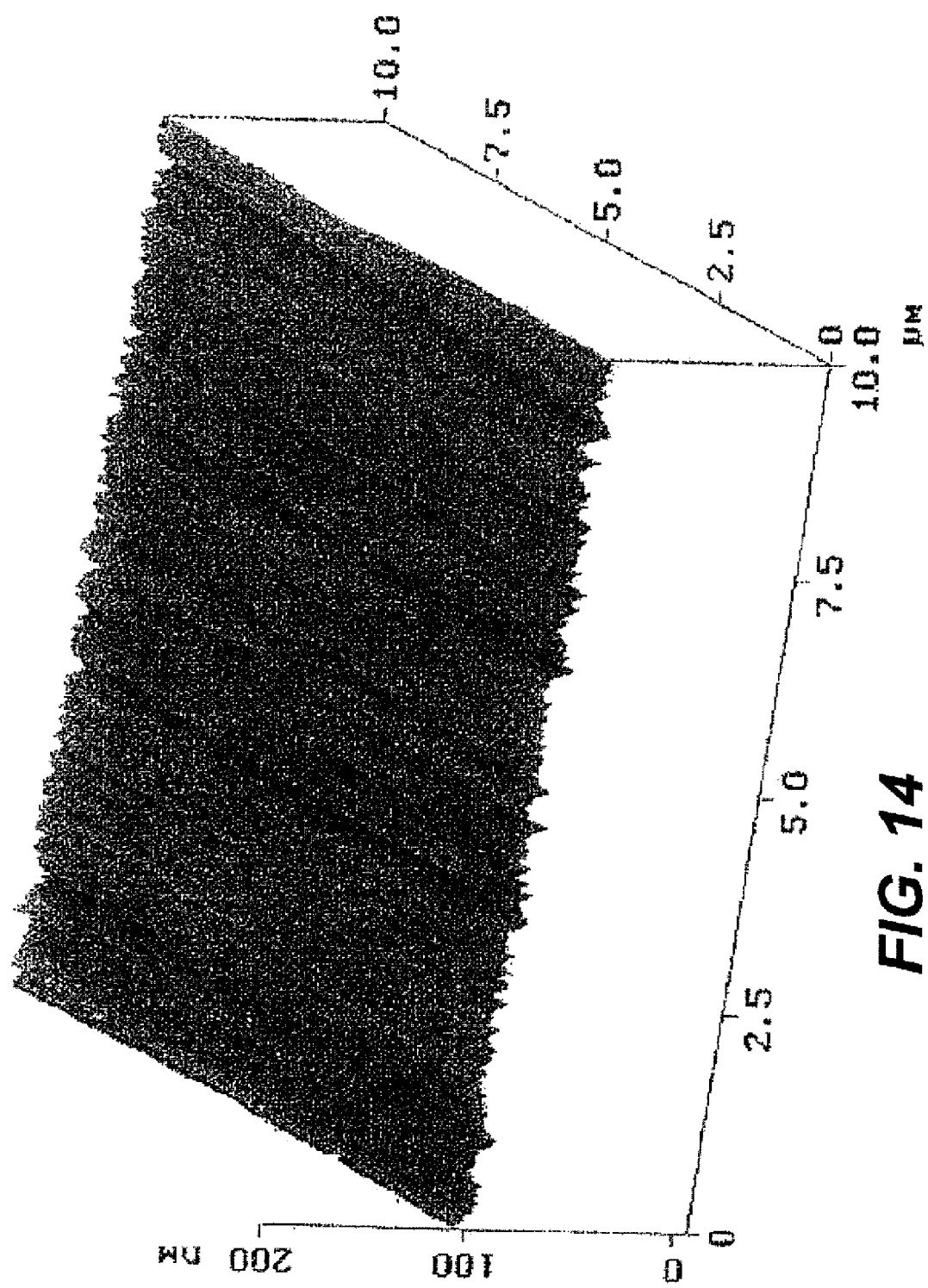
FIG. 14 is a computer image photographs (AFM) of the surface of the tape-shaped substrate of Test Example 3 after being polished.
Figure 15:
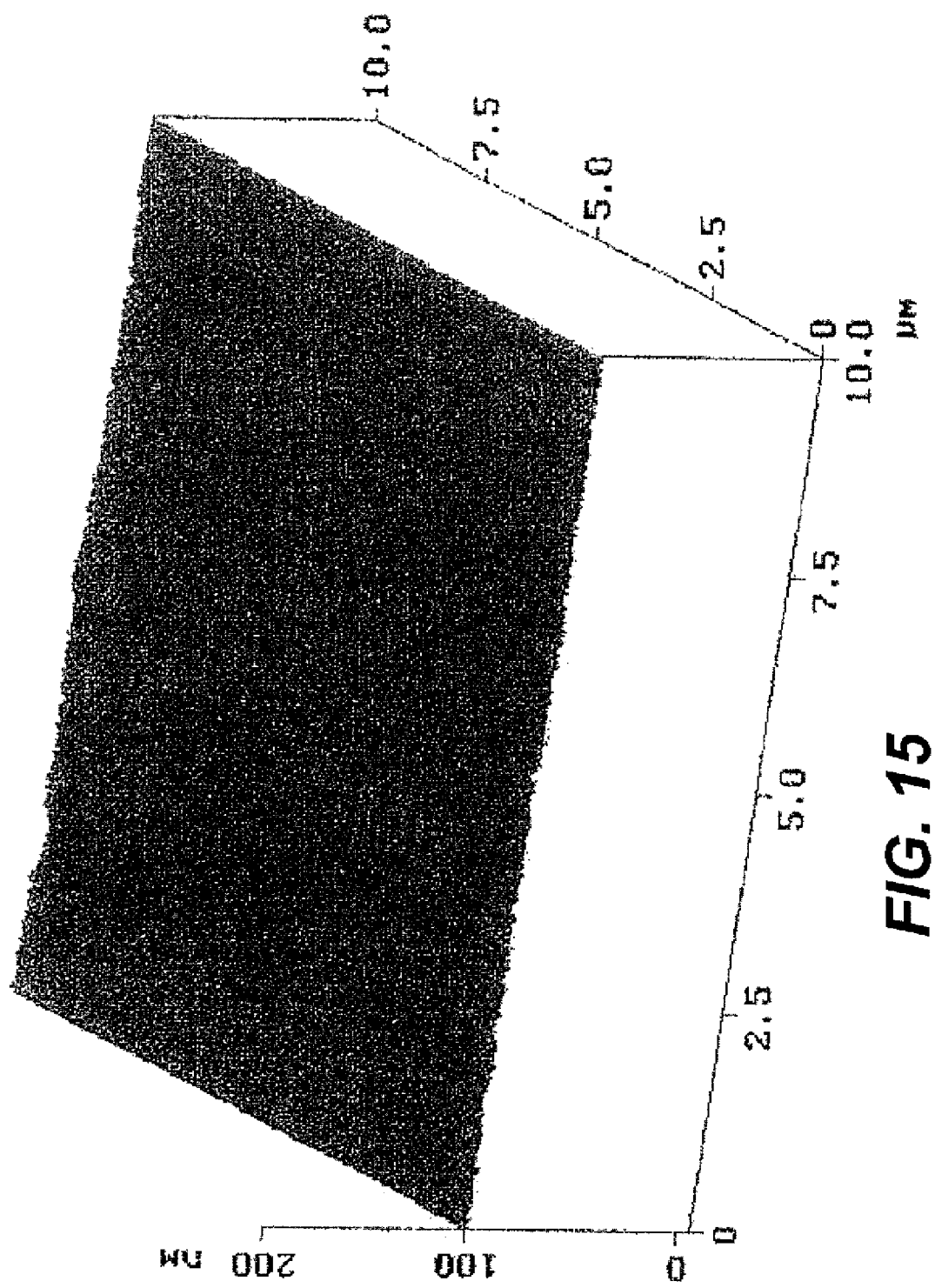
FIG. 15 is a computer image photographs (AFM) of the surface of the tape-shaped substrate of Test Example 4 after being polished.
Figure 16:
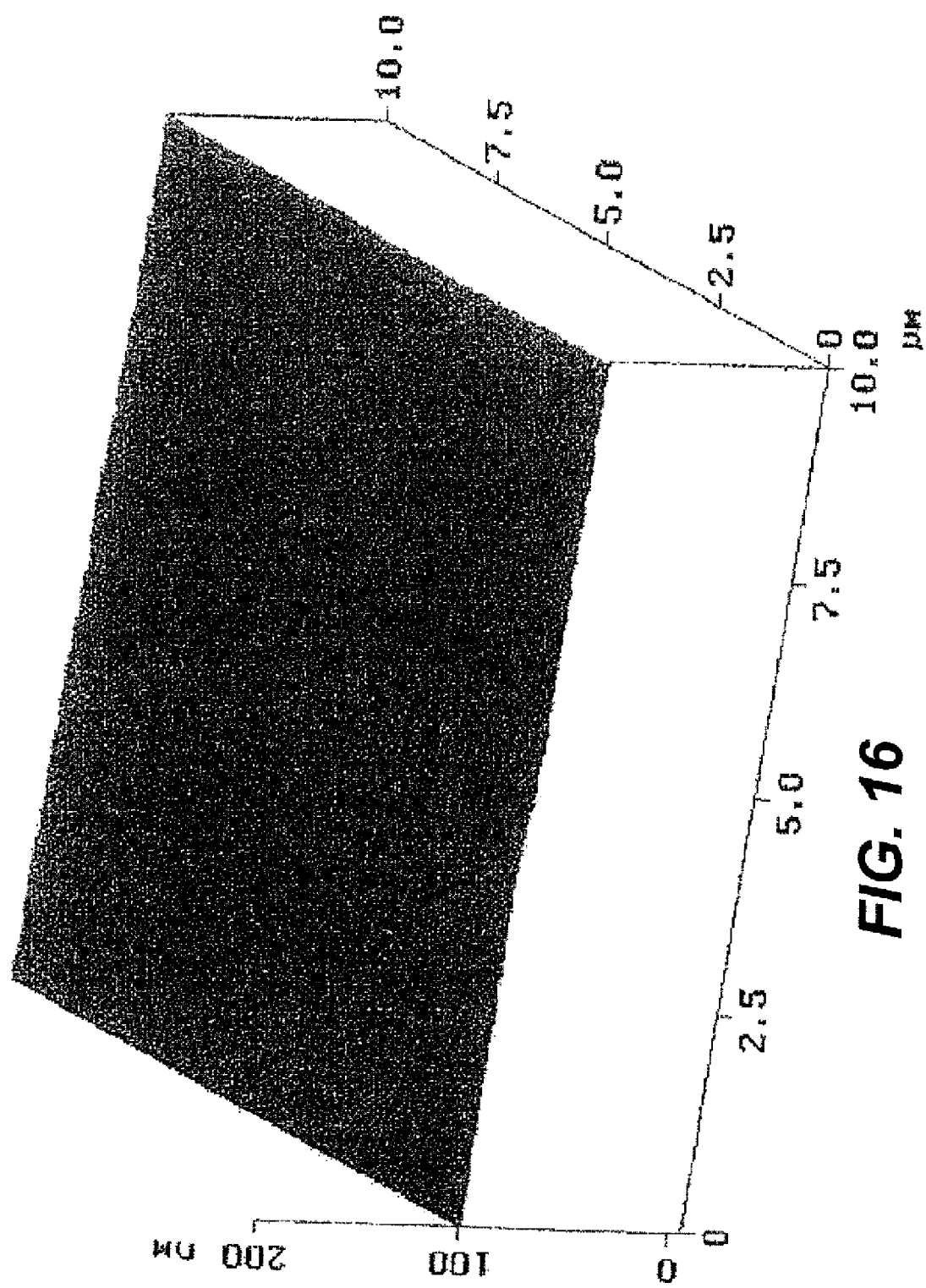
FIG. 16 is a computer image photographs (AFM) of the surface of the tape-shaped substrate of Test Example 5 after being polished.

Use was made of Hastelloy C-276 (such as 58% Ni-17% Mo-15% Cr-5% Fe-4% W) as the tape-shaped metallic substrate. Samples were those fabricated by a rolling technology into a thickness of 0.1 mm, a width of 10 mm and a length of several-hundred meters. FIG. 6 is a computer image photograph (by AFM) of the tape-shaped substrate surface prior to the polishing. Its average surface roughness $R_a$ was 20-50 nm prior to the polishing. The maximum surface roughness $R_{max}$ was 200-500 nm. The sharp protrusions are the rolling marks caused by the rolling.

A MgO film with thickness of 10-20 nm was formed by IBAD method as an intermediate layer with directionality. Next, Epi-MgO (MgO formed by Epitaxial Deposition method) with thickness of about 200 nm was formed.

The in-plane directionality ($\Delta\phi$) and perpendicular directionality ($\Delta\omega$) were measured by evaluating the full width at half maximum (FWHM) obtained from X-rays polar graphic measurement.

Experiments comprise test examples related to the present invention and comparison examples for the purpose of making comparisons with these test examples.

Comparison Example 1

This included only the first polishing process (as shown at 103 in FIG. 1) with two polishers using the same method arranged in series (as shown at 103a and 103b in FIG. 1) to carry out two-step random polishing. Slurry with polycrystalline diamond with average particle diameter D50 of 5 µm was used. An aqueous solution (30 wt %) with glycol compounds, glycerol and aliphatic acid as additives was adjusted to pH8. The polishing head was rotated while a polishing tape of a flocked cloth (fiber diameter=1.0 denier) was fed. The tape-shaped substrate was passed between compressing pads and the polishing process was carried out under the following conditions while the slurry was being supplied:
Rotational speed of the head: 400 rpm
Applied pressure: 8 kg
Supply rate of slurry: 10 ml/minute
Feeding speed of tape-shaped substrate: 5 m/hr
Polishing was carried out under the same conditions by the two polishers 103a and 103b.

Comparison Example 2

This included only the first polishing process (as shown at 103 in FIG. 1) with two polishers using the same method arranged in series (as shown at 103a and 103b in FIG. 1) to carry out two-step random polishing. Slurry with polycrystalline diamond with average particle diameter D50 of 3 μm was used. The other conditions were the same as in Comparison Example 1 described above.

Comparison Example 3

This included only the first polishing process (as shown at 103 in FIG. 1) with two polishers using the same method arranged in series (as shown at 103a and 103b in FIG. 1) to carry out two-step random polishing. Slurry with polycrystalline diamond with average particle diameter D50 of 1 μm was used. The other conditions were the same as in Comparison Example 1 described above.

Comparison Example 4

This included only the first polishing process with four polishers (only 103a and 103b being shown in FIG. 1) using the same method arranged in series to carry out four-step random polishing. The first two polishers used slurry with polycrystalline diamond with average particle diameter D50 of 1 μm. Next, the third polisher used slurry with polycrystalline diamond with average particle diameter D50 of 0.5 μm. Finally, the fourth polisher used slurry comprising colloidal silica with average particle diameter of 0.03 μm. The applied pressure was 8 kg in the first and third steps and 5 kg in the second and fourth steps.

Comparison Example 5

This included only the first polishing process with four polishers using the same method arranged in series to carry out four-step random polishing. The first polisher used slurry with polycrystalline diamond with average particle diameter D50 of 1 μm. Next, the second and third polisher used slurry with polycrystalline diamond with average particle diameter D50 of 0.5 μm. Finally, the fourth polisher used slurry comprising colloidal silica with average particle diameter of 0.03 μm. The applied pressure was 8 kg in the first and second steps and 5 kg in the third and fourth steps.

The fabrication conditions for these Comparison (Comp.) Examples are summarized below in Table 1.

TABLE 1

| Example | Polishing process Process | Step | Abrading particles D50 (μm) | Type of tape | Pressure (kg) | Speed of Rotation (rpm) | Direction of rotation by polishing head | Speed of feeding (m/h) |
|---|---|---|---|---|---|---|---|---|
| Comp. 1 | First (random) | First | Diamond: 5 | Flocked cloth | 8 | 400 | Clockwise | 5 |
|  |  | Second | Diamond: 5 | Flocked cloth | 8 | 400 | Clockwise | 5 |
| Comp. 2 | First (random) | First | Diamond: 3 | Flocked cloth | 8 | 400 | Clockwise | 5 |
|  |  | Second | Diamond: 3 | Flocked cloth | 8 | 400 | Clockwise | 5 |
| Comp. 3 | First (random) | First | Diamond: 1 | Flocked cloth | 8 | 400 | Clockwise | 5 |
|  |  | Second | Diamond: 1 | Flocked cloth | 8 | 400 | Clockwise | 5 |
| Comp. 4 | First (random) | First | Diamond: 1 | Flocked cloth | 8 | 400 | Clockwise | 5 |
|  |  | Second | Diamond: 1 | Flocked cloth | 5 | 300 | Counter clockwise | 5 |
|  |  | Third | Diamond: 0.5 | Flocked cloth | 8 | 400 | Clockwise | 5 |
|  |  | Fourth | Silica: 0.03 | Flocked cloth | 5 | 300 | Counter clockwise | 5 |
| Comp. 5 | First (random) | First | Diamond: 1 | Flocked cloth | 8 | 400 | Clockwise | 5 |
|  |  | Second | Diamond: 0.5 | Flocked cloth | 8 | 400 | Counter clockwise | 5 |
|  |  | Third | Diamond: 0.5 | Flocked cloth | 5 | 300 | Clockwise | 5 |
|  |  | Fourth | Silica: 0.03 | Flocked cloth | 5 | 300 | Counter clockwise | 5 |

Test Example 1

(1) Pretreatment Polishing

The first polishing process (as shown at 103 in FIG. 1) was carried out in two steps of random polishing (as shown at 103a and 103b in FIG. 1) by rotating the polishing heads while feeding flocked tapes to them, passing a tape-shaped substrate between pressing pads while supplying slurry under conditions described below. Slurry with polycrystalline diamond with average particle diameter D50 of 1 μm was used both in the first and second steps. An aqueous solution (30 wt %) with glycol compounds, glycerol and aliphatic acid as additives was adjusted to pH8. The concentration of the diamond abrading particles was about 0.3%.

Polishing Conditions for the First Step:
Rotational speed of the head: 400 rpm (in clockwise direction)
Flow rate of slurry: 10 ml/minutes
Applied pressure: 8 kg
Feeding speed of tape substrate: 5 m/hr
Polishing Conditions for the Second Step:
Rotational speed of the head: 300 rpm (in counter-clockwise direction)
Flow rate of slurry: 10 ml/minutes
Applied pressure: 5 kg
Feeding speed of tape substrate: 5 m/hr The RMS surface roughness of the tape substrate after the polishing process above was 3-4 nm.

(2) Polishing Program

The first polishing process (as shown at 103 in FIG. 1) was carried out in two steps of random polishing (as shown at 103a and 103b in FIG. 1) under conditions described below by rotating the polishing heads while feeding flocked tapes to them, passing a tape-shaped substrate between pressing pads while supplying slurry. In the first step, slurry with polycrystalline diamond with average particle diameter D50 of 0.125 μm was used. An aqueous solution (30 wt %) with glycol compounds, glycerol and aliphatic acid as additives was adjusted to pH8. The concentration of the diamond abrading particles was about 0.3%. In the second step, slurry with colloidal silica with average particle diameter D50 of 0.03 μm was used. An aqueous solution obtained by adding ammonium oxalate, potassium oxalate and glycerol to DEMOL EP (trade name, produced by Kao Kabushiki Kaisha) as adjusted to pH9 and used as additive.

Polishing Conditions for the First Step:
Rotational speed of the head: 400 rpm (in clockwise direction)
Flow rate of slurry: 10 ml/minutes
Applied pressure: 8 kg
Feeding speed of tape substrate: 5 m/hr
Polishing Conditions for the Second Step:
Rotational speed of the head: 300 rpm (in counter-clockwise direction)
Flow rate of slurry: 10 ml/minutes
Applied pressure: 5 kg
Feeding speed of tape substrate: 5 m/hr The second polishing process (as shown at 104 in FIG. 1) was carried out in two steps in the running direction (as shown at 104a and 104b in FIG. 1) under conditions described below by rotating the drums with non-woven cloth tapes made of polyester fibers (with diameter of 0.5 denier) wound around polishing heads, passing a tape-shaped substrate between pressing pads while supplying slurry. In both the first and second steps, slurry with polycrystalline diamond with average particle diameter D50 of 10 μm was used. An aqueous solution (30 wt %) with glycol compounds, glycerol and aliphatic acid as additives was adjusted to pH8. The concentration of the diamond abrading particles was about 0.3%.

Figure 18:
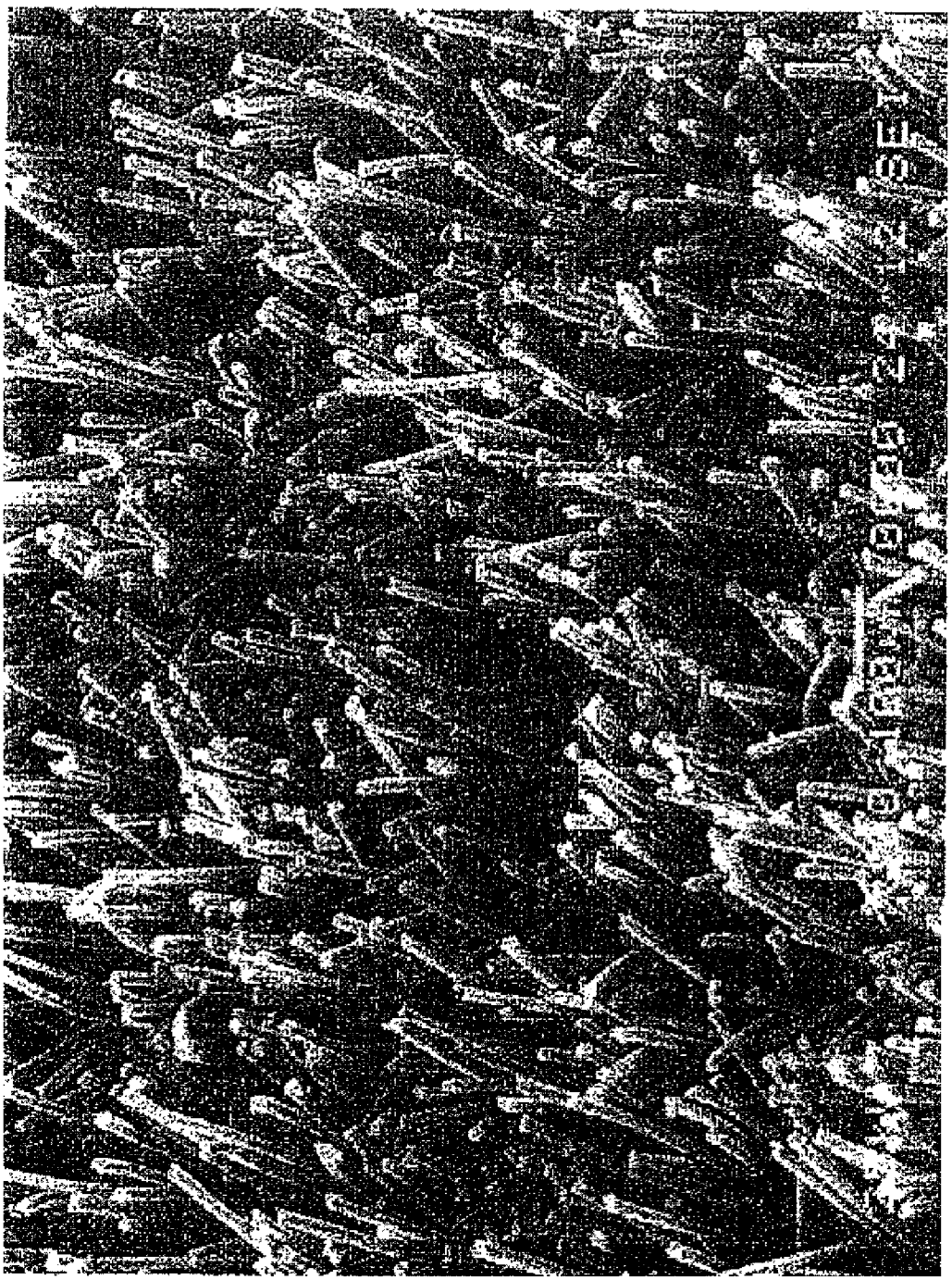
FIGS. 18 and 19 are respectively a SEM photograph of the surface of flocked cloth and non-woven cloth used as polishing cloth in the test examples of this invention.
Figure 19:
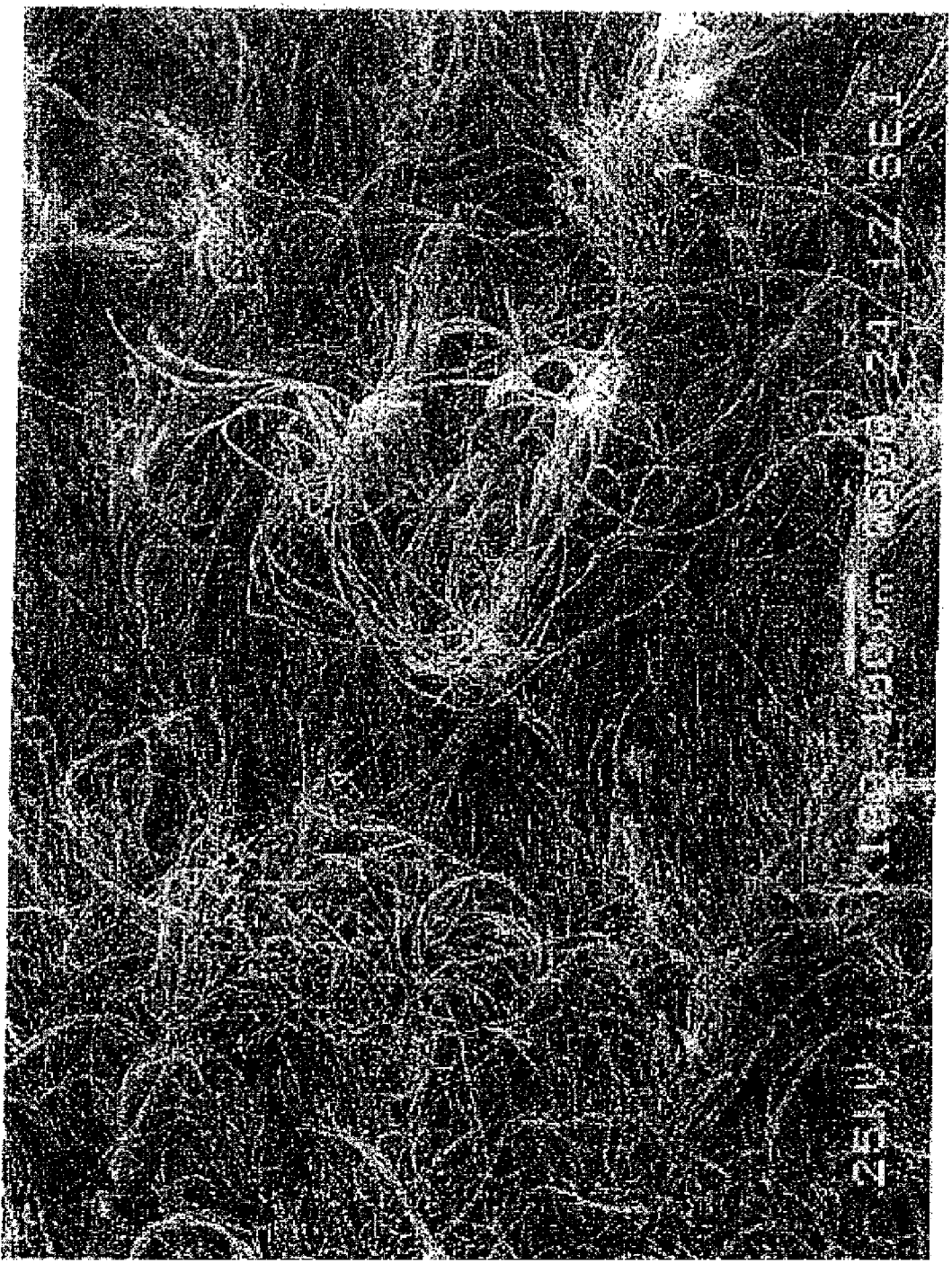

Polishing Conditions for Both the First and Second Steps:
Rotational speed of the head: 250 rpm
Flow rate of slurry: 10 ml/minutes
Applied pressure: 10 kg
Feeding speed of tape substrate: 5 m/hr SEM photographs of the flocked cloth tape (with diameter of 1.0 denier) and the non-woven cloth tape (with diameter of 0.5 denier) that were used in the test examples are shown respectively in FIGS. 18 and 19.

Test Example 2

The pretreatment polishing was carried out under the same polishing conditions as in Test Example 1.

The first polishing process (as shown at 103 in FIG. 1) was carried out under the same conditions as in Test Example 1.

The second polishing process (as shown at 104 in FIG. 4) was carried out in two steps of polishing in running direction with two polishers using the same method arranged in series (as shown at 104a and 104b in FIG. 1). Slurry with polycrystalline diamond with average particle diameter D50 of 5 μm was used. The other conditions were the same as in Test Example 1.

Test Example 3

The pretreatment polishing was carried out under the same polishing conditions as in Test Example 1.

The first polishing process (as shown at 103 in FIG. 1) was carried out under the same conditions as in Test Example 1.

The second polishing process (as shown at 104 in FIG. 4) was carried out in two steps of polishing in running direction with two polishers using the same method arranged in series (as shown at 104a and 104b in FIG. 1). Slurry with polycrystalline diamond with average particle diameter D50 of 3 μm was used, and the applied pressure was changed to 5 kg. The other conditions were the same as in Test Example 1.

Test Example 4

The pretreatment polishing was carried out under the same polishing conditions as in Test Example 1.

The first polishing process (as shown at 103 in FIG. 1) was carried out under the same conditions as in Test Example 1.

The second polishing process (as shown at 104 in FIG. 4) was carried out in two steps of polishing in running direction with two polishers using the same method arranged in series (as shown at 104a and 104b in FIG. 1). Slurry with polycrystalline diamond with average particle diameter D50 of 0.25 μm was used. The other conditions were the same as in Test Example 3.

Test Example 5

The pretreatment polishing was carried out under the same polishing conditions as in Test Example 1.

The first polishing process (as shown at 103 in FIG. 1) was carried out under the same conditions as in Test Example 1.

The second polishing process (as shown at 104 in FIG. 4) was carried out in two steps of polishing in running direction with two polishers using the same method arranged in series (as shown at 104a and 104b in FIG. 1). Slurry with polycrystalline diamond with average particle diameter D50 of 0.125 μm was used. The other conditions were the same as in Test Example 3.

The fabrication conditions for the test examples are summarized in Table 2 shown below.

TABLE 2

| Example | Polishing process Process | Step | Abrading particles D50 (μm) | Type of tape | Pressure (kg) | Speed of Rotation (rpm) | Direction of rotation by polishing head | Speed of feeding (m/h) |
|---|---|---|---|---|---|---|---|---|
| Test Example 1 | First (random) | 1st | Diamond: 0.125 | Flocked cloth | 8 | 400 | Clockwise | 5 |
| | | 2nd | Silica: 0.03 | Flocked cloth | 5 | 300 | Counter clockwise | 5 |
| | Second (running direction) | 1st | Diamond: 10 | Non-woven cloth | 10 | 250 | Running direction | 5 |
| | | 2nd | Diamond: 10 | Non-woven cloth | 10 | 250 | Running direction | 5 |
| Test Example 2 | First (random) | 1st | Diamond: 0.125 | Flocked cloth | 8 | 400 | Clockwise | 5 |
| | | 2nd | Silica: 0.03 | Flocked cloth | 5 | 300 | Counter clockwise | 5 |
| | Second (running direction) | 1st | Diamond: 5 | Non-woven cloth | 10 | 250 | Running direction | 5 |
| | | 2nd | Diamond: 5 | Non-woven cloth | 10 | 250 | Running direction | 5 |
| Test Example 3 | First (random) | 1st | Diamond: 0.125 | Flocked cloth | 8 | 400 | Clockwise | 5 |
| | | 2nd | Silica: 0.03 | Flocked cloth | 5 | 300 | Counter clockwise | 5 |
| | Second (running direction) | 1st | Diamond: 3 | Non-woven cloth | 5 | 250 | Running direction | 5 |
| | | 2nd | Diamond: 3 | Non-woven cloth | 5 | 250 | Running direction | 5 |
| Test Example 4 | First (random) | 1st | Diamond: 0.125 | Flocked cloth | 8 | 400 | Clockwise | 5 |
| | | 2nd | Silica: 0.03 | Flocked cloth | 5 | 300 | Counter clockwise | 5 |
| | Second (running direction) | 1st | Diamond: 0.25 | Non-woven cloth | 5 | 250 | Running direction | 5 |
| | | 2nd | Diamond: 0.25 | Non-woven cloth | 5 | 250 | Running direction | 5 |
| Test Example 5 | First (random) | 1st | Diamond: 0.125 | Flocked cloth | 8 | 400 | Clockwise | 5 |
| | | 2nd | Silica: 0.03 | Flocked cloth | 5 | 300 | Counter clockwise | 5 |
| | Second (running direction) | 1st | Diamond: 0.125 | Non-woven cloth | 5 | 250 | Running direction | 5 |
| | | 2nd | Diamond: 0.125 | Non-woven cloth | 5 | 250 | Running direction | 5 |

Evaluation

The RMS surface roughness of the target surface of the tape-shaped substrate after the polishing and the in-plane and perpendicular directionality of the intermediate layer after the intermediate layer film has been formed on the target surface were evaluated. The RMS surface roughness was measured by using a scanning probe microscope (Nanoscope Dimension 3100 Series (trade name) produced by Digital Instruments, Inc.).

FIGS. 6-16 are computer image photographs (AFM), each obtained by scanning an arbitrarily selected surface area of 10 μm×10 μm of a tape-shaped substrate and structuring three-dimensionally. FIG. 6 shows the surface condition of a tape substrate before being polished. FIGS. 7-11 show the surface conditions of the tape substrates of Comparison Examples 1-5, respectively, after being polished, and FIGS. 12-16 show the surface conditions of the tape substrates of Test Examples 1-5, respectively, after being polished.

Figure 17:
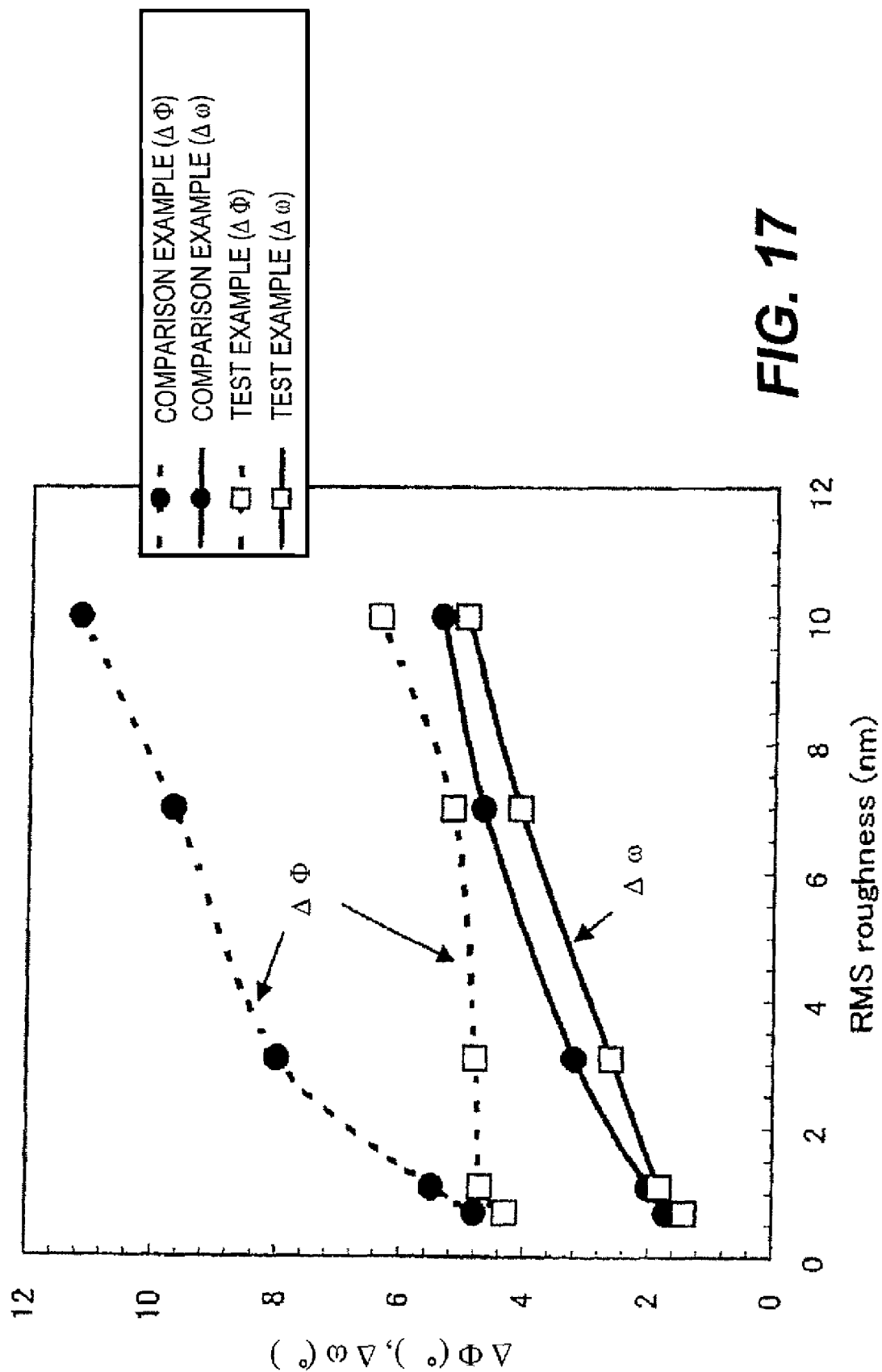
FIG. 17 is a graph for showing Δφ and Δω in the results of comparison experiments.

Table 3 shows the results of comparison experiments. FIG. 17 is a graph for showing $\Delta\phi$ and $\Delta\omega$ in the results of the comparison experiments.

TABLE 3

| | RMS surface roughness (nm) | Line density of grooves (line/μm) | In-plane directionality $\Delta\phi$ (°) | perpendicular directionality $\Delta\omega$ (°) |
|---|---|---|---|---|
| Comparison Example 1 | 10.4 | — | 11.2 | 5.4 |
| Comparison Example 2 | 7.0 | — | 9.7 | 4.7 |

TABLE 3-continued

|  | RMS surface roughness (nm) | Line density of grooves (line/μm) | In-plane directionality Δφ (°) | perpendicular directionality Δω (°) |
|---|---|---|---|---|
| Comparison Example 3 | 3.1 | — | 8 | 3.2 |
| Comparison Example 4 | 1.1 | — | 5.5 | 2.0 |
| Comparison Example 5 | 0.7 | — | 4.8 | 1.7 |
| Test Example 1 | 10.4 | 5 | 6.4 | 5.0 |
| Test Example 2 | 7.1 | 6 | 5.2 | 4.1 |
| Test Example 3 | 3.2 | 20 | 4.8 | 2.6 |
| Test Example 4 | 1.2 | 30 | 4.7 | 1.8 |
| Test Example 5 | 0.7 | 58 | 4.3 | 1.4 |

As shown in Table 3 and FIG. 17, if the target surface of a tape-shaped substrate is polished in the running direction such that its RMS surface roughness becomes 10 nm or less and the line density of the grooves becomes in the range of 50 line/μm-5 line/μm, the in-plane directionality (Δφ) can be made small (7° or less) over a wide range of surface roughness and the perpendicular directionality (Δω) also comes to take upon a small value, that is, a superior directionality characteristic can be achieved.

It has also come to be understood by the comparison experiments that the value of the in-plane directionality (Δφ) can be made smaller by Test Examples of this invention (as compared to the random polishing of Comparison Examples) although the value of the perpendicular directionality (Δω) is more or less similar. This indicates that the value of Δφ is improved by the grooves in the running direction, rather than by the surface roughness.

It has further come to be understood by the comparison experiments that extremely superior directionality can be obtained when the thickness of the intermediate layer is 1 μm or less (0.22 μm according to Test Examples) if the polishing method of this invention is used instead of the random polishing method. Since the polishing method of this invention is suited for mass production with a wide margin given to the crystalline directionality, it may be expected that the method of invention can be effective in many other fields of application.

Although the invention has been described above with reference to a limited number of examples, these examples are intended to be demonstrative, rather than limitative. Many modifications and variations are possible within the scope of this invention. For example, the number of steps in the random polishing device, materials for the polishing tape or pad, the rotational speed of the polishing head, the magnitude of the pressure to be applied during the polishing, the kinds of slurry and abrading particles, the flow rate of the slurry, the speed at which the tape-shaped substrate is to be fed, etc. may be varied appropriately.

What is claimed is:

1. A method of polishing a target surface of a tape-shaped substrate of an oxide superconductor, said superconductor comprising an intermediate layer formed on said target surface of said tape-shaped substrate and an oxide superconductor thin film, said method comprising a polishing step of polishing said target surface while causing said tape-shaped substrate to continuously run in a running direction, said polishing step including an initial polishing process for carrying out random polishing of said target surface and a finishing process that is carried out after said initial polishing process for forming grooves on said target surface along said running direction.

2. The method of claim 1 wherein said random polishing process is carried out so as to finish said target surface to a surface roughness of 5 nm or less.

3. The method of claim 1 wherein said finishing process is carried out such that the surface roughness of said target surface in a perpendicular direction to said running direction becomes 10 nm or less.

4. The method of claim 1 wherein said finishing process is carried out such that said grooves come to have a line density of 50 line/μm-5 line/μm.

5. The method of claim 1 wherein said finishing process is carried out such that said grooves come to have a width of 20 nm-200 nm.

6. The method of claim 1 wherein said finishing process is carried out such that said grooves come to have a width of 20 nm-50 nm.

7. The method of claim 1 wherein said finishing process is carried out such that the surface roughness inside said grooves becomes 1 nm or less.

8. The method of claim 1 wherein said finishing process is carried by using slurry containing polycrystalline diamond and a polishing tape or a polishing pad of a material selected from the group consisting of flocked cloth, raised cloth, woven cloth and non-woven cloth.

9. A substrate for oxide superconductor comprising:
   a tape-shaped substrate polished by a method of claim 1; and
   an intermediate layer formed on said tape-shaped substrate;
wherein said intermediate layer has an in-plane directionality of 7° or less.

10. The substrate of claim 9 wherein said tape-shaped substrate is fabricated by rolling a material selected from the group consisting of nickel, nickel alloys and stainless steel.

* * * * *